(12) United States Patent
Oliver et al.

(10) Patent No.: US 6,477,193 B2
(45) Date of Patent: Nov. 5, 2002

(54) EXTREME REPETITION RATE GAS DISCHARGE LASER WITH IMPROVED BLOWER MOTOR

(75) Inventors: I. Roger Oliver, San Diego; William N. Partlo, Poway, both of CA (US)

(73) Assignee: Cymer, Inc., San Diego, CA (US)

( * ) Notice: Subject to any disclaimer, the term of this patent is extended or adjusted under 35 U.S.C. 154(b) by 94 days.

(21) Appl. No.: 09/748,316

(22) Filed: Dec. 22, 2000

(65) Prior Publication Data

US 2002/0044587 A1 Apr. 18, 2002

Related U.S. Application Data

(63) Continuation-in-part of application No. 09/684,629, filed on Oct. 6, 2000, and a continuation-in-part of application No. 09/608,543, filed on Jun. 30, 2000, and a continuation-in-part of application No. 09/370,739, filed on Aug. 9, 1999, now Pat. No. 6,151,346, which is a continuation-in-part of application No. 09/118,733, filed on Jul. 18, 1998, now Pat. No. 5,936,988.

(51) Int. Cl.$^7$ ................................................. H01S 3/22
(52) U.S. Cl. ............................ 372/58; 372/34; 372/98
(58) Field of Search ............................. 372/55, 57, 38, 372/34, 37, 98; 307/106

(56) References Cited

U.S. PATENT DOCUMENTS

| | | | |
|---|---|---|---|
| 3,849,670 A | 11/1974 | Lourogan | 307/108 |
| 4,549,091 A | 10/1985 | Fahlen et al. | 307/106 |
| 4,697,270 A | 9/1987 | Galkowski | 372/34 |
| 4,798,467 A | 1/1989 | Wyeth et al. | 356/349 |
| 4,803,378 A | 2/1989 | Richardson | 307/108 |
| 4,817,101 A | 3/1989 | Wyeth et al. | 372/32 |
| 4,940,331 A | 7/1990 | Wyeth et al. | 356/349 |
| 5,023,884 A | 6/1991 | Akins et al. | 372/57 |
| 5,025,445 A | 6/1991 | Anderson et al. | 372/20 |
| 5,095,492 A | 3/1992 | Sandstrom | 372/102 |
| 5,124,629 A | 6/1992 | Ball et al. | 323/268 |
| 5,128,601 A | 7/1992 | Orbach et al. | 372/30 |

(List continued on next page.)

FOREIGN PATENT DOCUMENTS

| | | | | |
|---|---|---|---|---|
| JP | WO 91/01587 | * | 9/1990 | H02K/9/19 |

OTHER PUBLICATIONS

Yanagise, et al., "Solid State Pulsed Power S Device for Excimer Laser," *Proceedings of the Joint Conference on Electronic Devices and Semiconductor Power Conversions,* Tokyo, Japan, pp. 1–15 (Sep. 13, 1995).

(List continued on next page.)

*Primary Examiner*—Leon Scott, Jr.
(74) *Attorney, Agent, or Firm*—John R. Ross

(57) ABSTRACT

A gas discharge laser capable of operating at pulse rates in the range of 4,000 Hz to 6,000 Hz at pulse energies in the range of 5 mJ to 10 mJ or greater. Important improvements over prior art designs include: (1) a squirrel cage type fan for producing gas velocities through the discharge region of more than 67 m/s and capable of continuous trouble-free operation for several months, (2) a liquid cooled drive motor having a low loss sealing member separating the motor rotor from the motor starter and protecting the motor from the laser gas and a breach detection device for detecting any breach of the sealing member, (3) a heat exchanger system capable of removing in excess of 16 kw of heat energy from the laser gas and (4) a pulse power system capable of providing precisely controlled electrical pulses to the electrodes needed to produce laser pulses at the desired pulse energies in the range of 5 mJ to 10 mJ or greater at pulse repetition rates in the range of 4,000 Hz to 6,000 Hz or greater.

28 Claims, 20 Drawing Sheets

U.S. PATENT DOCUMENTS

| | | | |
|---|---|---|---|
| 5,138,622 A | | 8/1992 | Friede et al. .................. 372/38 |
| 5,142,166 A | | 8/1992 | Birx ........................... 307/419 |
| 5,177,754 A | | 1/1993 | Ball et al. ...................... 372/38 |
| 5,309,462 A | * | 5/1994 | Taylor et al. .................. 372/38 |
| 5,313,481 A | | 5/1994 | Cook et al. .................... 372/37 |
| 5,315,611 A | * | 5/1994 | Ball et al. ...................... 372/38 |
| 5,319,665 A | | 6/1994 | Brix ............................ 372/69 |
| 5,359,279 A | | 10/1994 | Gidon et al. ................ 323/282 |
| 5,371,587 A | | 12/1994 | de Groot et al. ............ 356/349 |
| 5,420,877 A | | 5/1995 | Sandstrom .................... 372/34 |
| 5,448,580 A | | 9/1995 | Brix et al. ...................... 372/38 |
| 5,450,207 A | | 9/1995 | Fomenkov .................. 356/416 |
| 5,514,918 A | * | 5/1996 | Inatomi et al. ............. 307/106 |
| 5,524,144 A | | 6/1996 | Suzuki ........................ 359/176 |
| 5,691,989 A | | 11/1997 | Rakuljic ....................... 372/20 |
| 5,706,301 A | | 1/1998 | Lagerström ................... 372/32 |
| 5,729,562 A | * | 3/1998 | Brix et al. ...................... 372/38 |
| 5,754,571 A | | 5/1998 | Endoh et al. .................. 372/20 |
| 5,848,089 A | * | 12/1998 | Sarkar .......................... 372/58 |
| 5,852,621 A | | 12/1998 | Sandstrom .................... 372/25 |
| 5,870,420 A | | 2/1999 | Webb ........................... 372/58 |
| 5,936,988 A | * | 8/1999 | Partlo et al. ................... 372/38 |
| 5,978,405 A | | 11/1999 | Juhasz et al. .................. 372/57 |
| 5,982,800 A | * | 11/1999 | Ishihara et al. ............... 372/57 |
| 5,991,324 A | | 11/1999 | Knowles et al. .............. 372/57 |
| 6,005,879 A | | 12/1999 | Sandstrom et al. ........... 372/25 |
| 6,026,103 A | * | 2/2000 | Oliver et al. .................. 372/57 |
| 6,078,599 A | | 6/2000 | Everage et al. ............... 372/20 |
| 6,128,323 A | * | 10/2000 | Myeres et al. ................. 372/57 |
| 6,151,346 A | * | 11/2000 | Partlo et al. ................... 372/38 |
| 6,240,112 B1 | * | 5/2001 | Partlo et al. ................... 372/34 |
| 2002/0021728 A1 | * | 2/2002 | Newman et al. .............. 372/55 |
| 2002/0044597 A1 | * | 4/2002 | Oliver et al. .................. 372/58 |

OTHER PUBLICATIONS

Yanase, et al., "Solid State Pulse Power Module for Excimer Laser," *Electronic Devices and Semiconductor Power Conversion Joint Research Society*, Tokyo, Japan, pp. 1–9 (Sep. 13, 1995).

Birx, et al., "Basic Principals Governing the Design of Magnetic Switches," Lawrence Livermore Laboratory, Publication UCID 18831, pp. 1–25 (Nov. 18, 1980).

Birx, et al., "Regulation and Drive System for High Rep–Rate Magnetic Pulse Compressors," IEEE Conference Record of 1982 Fifteenth Power Modulator Symposium, Livermore, California, pp. 15–21 (1982).

Ishihara et al., "Advanced Krypton Fluoride Excimer Laser for Microlithography," *SPIE* vol. 1674, Optical/Laser Microlithography V, pp. 473–485 (1992).

Lassiter and Johannessen, "High–Power Pulse Generation Using Semiconductors and Magnetic Cores," AIEE Summer General Meeting, pp. 511–517 (Nov. 1960).

Melville, "The Use of Saturable Reactors as Discharge Devices for Pulse Generators,"Radio Section, Paper No. 1034, pp. 185–207 (Sep. 15, 1950).

Merritt and Dreifuerst, "Development and Operation of a Solid–State Switch for Thyratron Replacement," Lawrence Livermore National Laboratory, Publication UCR-L–JC–105355 (Jun. 14, 1991).

Ness, et al., "Command Resonant Charging System For a 350 kW Average Power Line Type Modulator," Conference Record of the $21^{st}$ International Power Modulator Symposium, Costa Mesa, California, pp. 159–163 (1994).

Newton and Watson, "Timing and Voltage Control of Magnetic Modulators on ETA II," $7^{th}$ IEEE Pulsed Power Conference Proceedings, pp. 175–177.

White, et al., "The Charging Circuit of the Line–Type Pulser," Chapter 9, Pulse Generators, Glas and Labacqz editors, pp. 355–380 (1948).

* cited by examiner

EXTREME REPETITION RATE GAS DISCHARGE LASER WITH IMPROVED BLOWER MOTOR

The present invention is a continuation-in-part of Ser. No. 09/684,629 filed Oct. 6, 2000 and Ser. No. 09/370,739, filed Aug. 9, 1999 now U.S. Pat. No. 6,151,346 which was a continuation-in-part of Ser. No. 09/118,773, filed Jul. 18, 1998 now U.S. Pat. No 5,936,988 and Ser. No. 09/608,543, filed Jun. 30, 2000. This invention relates to gas discharge lasers and in particular to high repetition rate gas discharge lasers.

BACKGROUND OF THE INVENTION

Electric Discharge Gas Lasers

Electric discharge gas lasers are well known and have been available since soon after lasers were invented in the 1960s. A high voltage discharge between two electrodes excites a gaseous gain medium. A resonance cavity containing the gain medium permits stimulated amplification of light which is then extracted from the cavity in the form of a laser beam. Many of these electric discharge gas lasers are operated in a continuous or pulse mode.

Excimer Lasers

Excimer lasers are a particular type of electric gas discharge laser and have been known as such since the mid 1970s. A description of an excimer laser, useful for integrated circuit lithography, is described in U.S. Pat. No. 5,023,884 issued Jun. 11, 1991 entitled "Compact Excimer Laser." This patent has been assigned to Applicants' employer, and the patent is hereby incorporated herein by reference. The excimer laser described in Patent '884 is a high repetition rate pulse laser. In FIG. 1, the principal elements of the laser 10 are shown (FIG. 1 corresponds to FIG. 1 in Patent '884). The discharges 22 are between two long (about 23 inches) electrodes 18 and 20 spaced apart by about ⅝ inch. Repetition rates of prior art lasers, like the one described, are typically within the range of about 100 to 1000 pulses per second. These high repetition rate lasers are usually provided with a gas circulation system. In the above referred to laser, this is done with a long squirrel-cage type fan 46, having blades 48 as shown in FIG. 1 and in FIG. 2 which is FIG. 7 in Patent '884. The fan blade structure is slightly longer than the electrodes 18 and 20 and provides sufficient circulation so that at pulse rates between 100 to 1000 Hz, the discharge disturbed gas between the electrodes is cleared between pulses. The shaft 130 of fan 46 is supported by two ball bearings 132 as shown in FIG. 2A which is FIG. 9 of Patent '884. The gas used in the laser contains fluorine which is extremely reactive. The fan rotor driving fan shaft 130 is sealed, within the same environmental system provided by housing structure members 12 and 14, by sealing member 136 as explained at column 9, line 45 of Patent '884, and the motor stator 140 is outside sealing member 136 and thus protected from the corrosive action of the fluorine gas. However, bearing 132 is subjected to the corrosive action of the chamber gas as is the lubrication used in the bearing. Corrosion of the bearings and bearing lubrication can contaminate the gas.

Pulse Power

Electric discharge gas lasers of the type described in U.S. Pat. No. 5,023,884 utilize an electric pulse power system shown in FIG. 3 to produce the electrical discharges, between the two electrodes. In such prior art systems, a direct current power supply 22 charges a capacitor bank called "the charging capacitor" or "$C_0$" 42 to a predetermined and controlled voltage called the "charging voltage" for each pulse. The magnitude of this charging voltage may be in the range of about 500 to 1000 volts. After $C_0$ has been charged to the predetermined voltage, a solid state switch 46 is closed allowing the electrical energy stored on $C_0$ to ring very quickly through a series of magnetic compression circuits comprising capacitor banks 52, 62 and 82 and inductors 48, 54 and 64 and a voltage transformer 56 to produce high voltage electrical potential in the range of about 16,000 volts across the electrode which produces the discharge which lasts about 50 ns.

In prior art systems on the market the time between the closing of the solid state switch and the discharge is in the range of about 5 microseconds; however, the charging of $C_0$ accurately to the pre-selected voltage has in the past required about 400 microseconds which was quick enough for pulse repetition rates of less than about 2,000 Hz. The reader should understand that accurate charging of $C_0$ is very important since the control of the voltage level on $C_0$ is in these systems the only practical control the laser operator has on the discharge voltage which in turn is the primary determiner of laser pulse energy.

Fan

U.S. Pat. No. 6,026,103 granted to some of the Applicants and others describe a gas discharge laser with a fan supported by roller bearings and magnetic axial positioning. In a preferred embodiment, the magnetic axial positioning was provided using a reluctance centering strategy in which the motor rotor was offset within the motor stator from its axially stable position. The embodiment described in detail in that patent included a ball and plate assembly at the non-drive end of the shaft for reacting the magnetic force created by the rotor offset. This laser was designed for repetition rates higher than the prior art 1000 Hz repetition rates. The squirrel cage-type fan blade was increased in size from 3.25 inches diameter to 5 inches and the fan was designed to operate at 5000 rpm as compared to 3000 rpm for a popular prior art design. Lifetime tests of the fan bearings described in the '103 patent produced significant wear of the bearing plate at the non-drive (idle) end.

Heat Exchanger

Prior art excimer lasers used for integrated circuit lithography typically require a system for cooling the laser gas which is heated both by the electric discharges and by the energy input through circulating fan discussed above. This is typically done with a water cooled, finned heat exchanger shown at 58 in FIG. 1.

Control of Beam Quality

When used as a light source for integrated circuit lithography excimer lasers, the laser beam parameters (i.e., pulse energy wavelength and bandwidth) typically are controlled to within tight specifications. This requires line narrowing of the laser beam (typically using a line narrowing module comprising a prism beam expander and a diffraction grating) and pulse-to-pulse feedback control of pulse energy and somewhat slower feedback control of wavelength.

What is needed is a better laser design for a pulse gas discharge laser for operation at repetition rates in the range of 4,000 to 6,000 pulses per second.

SUMMARY OF THE INVENTION

The present invention provides a gas discharge laser capable of operating at pulse rates in the range of 4,000 Hz to 6,000 Hz at pulse energies in the range of 5 mJ to 10 mJ or greater. Important improvements over prior art designs include: (1) a squirrel cage type fan for producing gas velocities through the discharge region of more than 67 m/s and capable of continuous trouble-free operation for several months, (2) a liquid cooled drive motor having a low loss sealing member separating the motor rotor from the motor starter and protecting the motor from the laser gas and a breach detection device for detecting any breach of the sealing member, (3) a heat exchanger system capable of removing in excess of 16 kw of heat energy from the laser gas and (4) a pulse power system capable of providing precisely controlled electrical pulses to the electrodes needed to produce laser pulses at the desired pulse energies in the range of 5 mJ to 10 mJ or greater at pulse repetition rates in the range of 4,000 Hz to 6,000 Hz or greater.

DETAILED DESCRIPTION OF PREFERRED EMBODIMENTS

Preferred embodiments of the present invention can be described by reference to the drawings.

First Preferred Embodiment

A first preferred embodiment of the present invention includes important improvements over prior art lasers which permit operation at repetition rates of 4,000 Hz to 6,000 Hz with pulse energies in the range of 5 mJ to 10 mJ or higher. In order to accommodate these performance improvements important changes were made to the chamber gas flow path, the fan, the pulse power system, the heat exchanger design and the system for measuring and control of beam parameters.

Laser Chamber Flow Path

Figure 4:
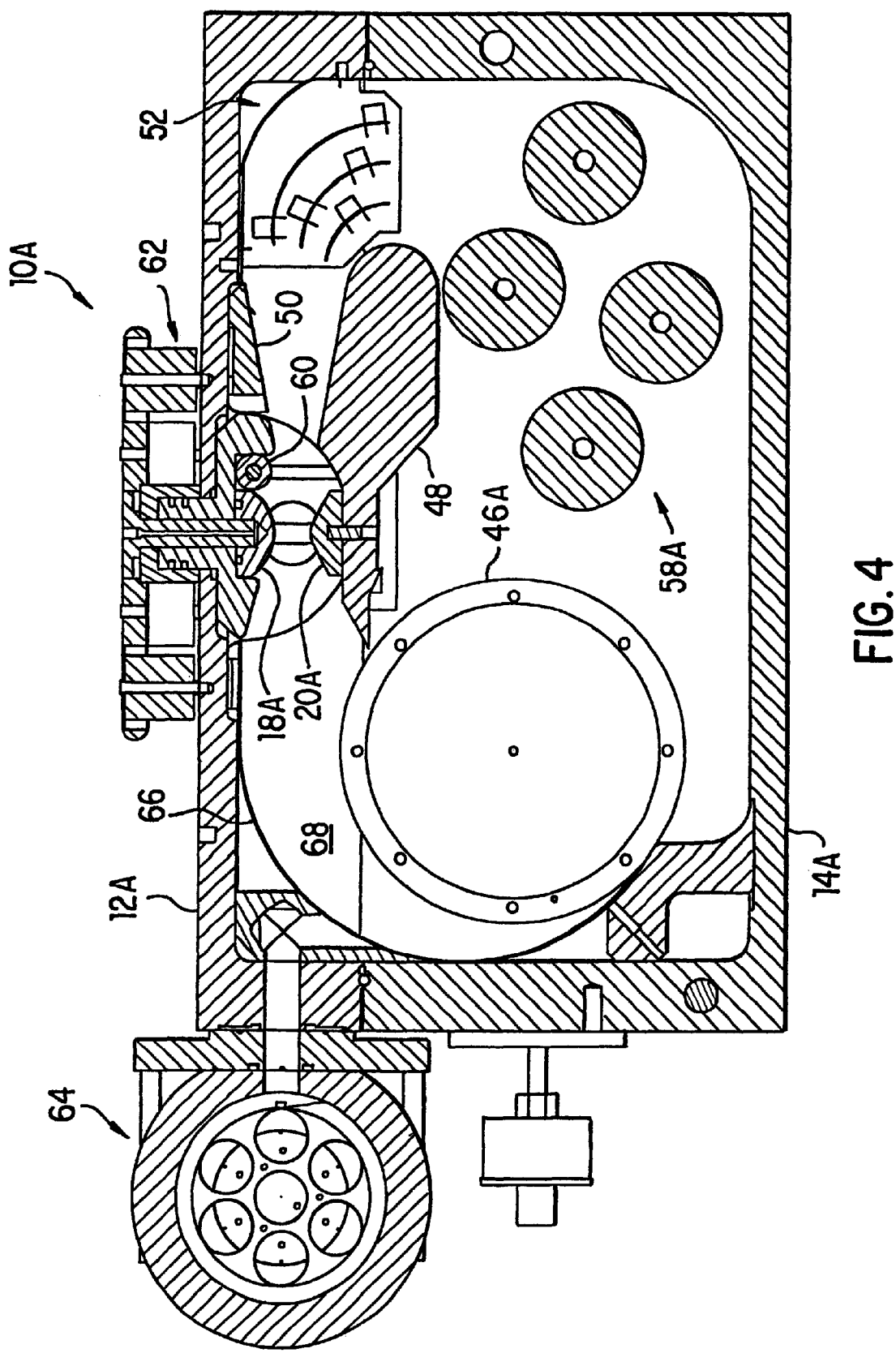
FIGS. 4 and 4A show cross sections of laser chambers of preferred embodiments of the present invention.

FIG. 4 is a cross section drawing of a laser chamber 10A of a first preferred embodiment of the present invention. The principal chamber components are housing structure members 12A and 14A, cathode 18A and anode 20A downstream preionizer tube 60, peaking capacitor bank 62 and electrostatic trap unit 64 (all of which are similar to the prior art corresponding components shown in FIG. 1). A new anode support flow shaping structure 48, a new upper flow shaping structure 50, gas turning vanes 52, a new squirrel cage type fan blade structure 46A and four water cooled heat exchanger units 58A.

This preferred embodiment is designed to operate at pulse repetition rates of 4,000 to 6,000 pulses per second or greater. Clearing the discharge region of discharge affected gas between pulses requires a gas flow between the electrodes 18A and 20A of up to about 67 m/s. To achieve these speeds, the diameter of squirrel cage fan unit has been set at 5 inches (the length of the blade structure is 26 inches) and the rotational speed has been increased to about 5000 rpm. This has required a larger motor which at 5000 rpm and operating conditions delivers about 4.5 kw of drive power to the fan blade structure. At a pulse rate of 6000 Hz, the discharge will add about 12 kw of heat energy to the laser gas. To remove the heat produced by the discharge along with the heat added by the fan (a total of more than 16 kw) four separate water cooled finned heat exchanger units 58A are provided. These units are described in detail below.

In this preferred embodiment, gas flow into and out of the discharge region has been greatly improved over prior art laser chambers. Vane structure 66 is designed to normalize gas velocity in the region 68, just downstream of the fan blade structure at about 20 m/s. The velocity of the gas then speeds up in the discharge region to the design velocity of 67 m/s. At about 4 inches downstream of the center of the discharge region, the flow cross section increases at an angle of 20 degrees from about ⅝ inch to about 4 inches before the gas is turned by four turning vanes 52. This permits recovery of a large percentage of the pressure drop through the discharge region.

Figure 4A:
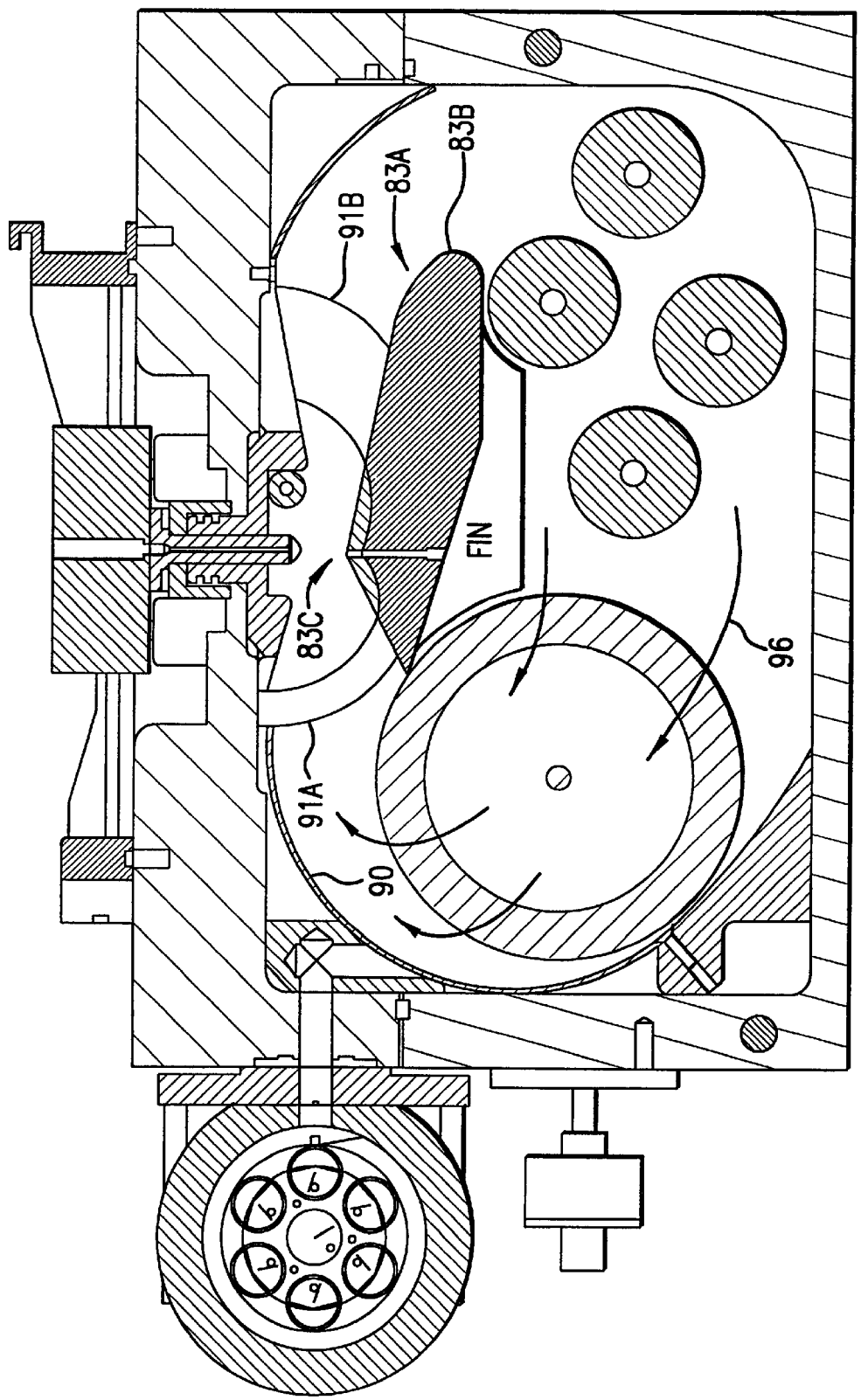

FIG. 4A shows an alternative chamber design where the current returns are blade type and the anode structure 83A is provided with an erosion pad 83C and a lower cooling fin 83F added primarily to reduce the magnitude of laser gas temperature cycles during burst mode operation. Arrows 96 slow the flow path of laser gas through the tangential squirrel cage fan.

Fan

Bearing Designs

Roller Bearing—Ball Bearing Combination

Figure 5:
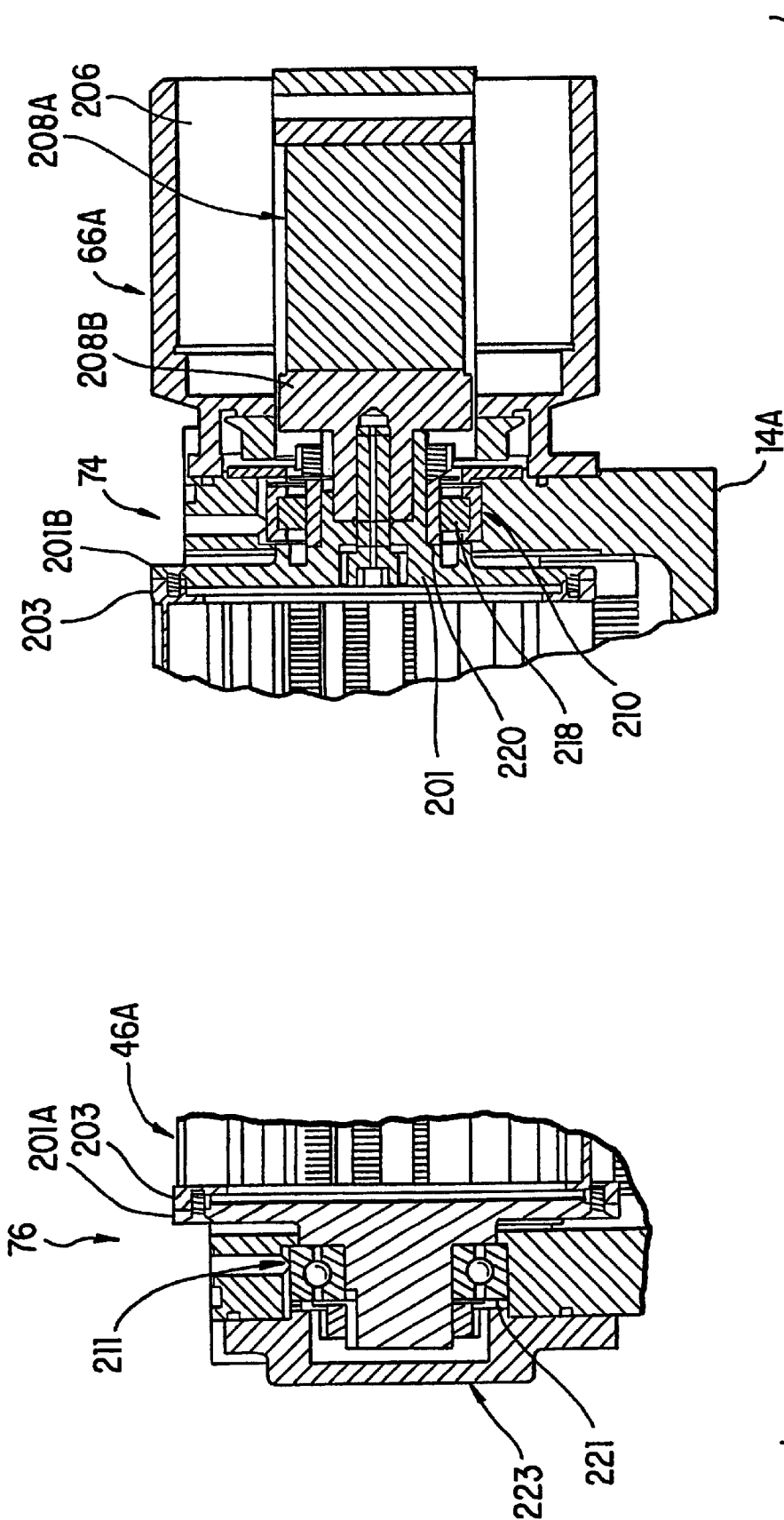
FIG. 5 shows a first fan design used in a preferred embodiment of the present invention.

A preferred bearing design for supporting the fan blade structure and the fan motor for 4,000 to 6,000 Hz operation is shown in FIG. 5. This design features a ceramic roller bearing assembly 74 at the drive end of the fan blade structure 46A and a ceramic ball bearing assembly 76 at the non-drive or idle end of the fan blade structure.

In this preferred embodiment the fan motor 66A drives a fan shaft consisting of shaft structures 201A and 201B which are bolted to squirrel cage cross flow fan structure 203. Axial positioning is provided by ball bearing assembly 76 and the bearing is preloaded with an axial magnetic force produced by stator coil 206 on rotor 208 caused by the radially positioned rotor magnets being axially offset from the axial magnetic center (by about 0.25 inches) of the magnetic fields produced by the stator coil. This off center alignment exerts a force on the shaft directed toward the drive end of the shaft of about 20 pounds. The force is reacted by preloading ball bearing assembly 76.

Roller Bearing

In this preferred embodiment roller bearing assembly 74 is comprised of outer race 210 made from a ceramic material (preferably zirconium oxide). The outer race 210 is shrink fitted into the chamber structure. Shoulders of outer race 210 hold cylindrical rollers 218 in their proper axial position. Inner race 220 is elongated to allow axial movement of shaft relative to the walls of chamber 14A due to transient and unequal thermal expansion or contraction. Inner race 220 preferably comprised of zirconium oxide is held in its proper position on shaft 201 by a bearing clamp nut and locking washer.

Roller bearings take advantage of a thin line type contact between rolling elements and races (as compared with a small point type contact in ball bearings) and typically have very high load capacity as compared to ball bearings. Since wear is a strong function of stress it follows that a design using such bearings with relatively light loads should result in a very long service life for the bearings.

The bearings, as indicated above, are preferably manufactured from ceramic materials (zirconium oxide races/silicon nitride rolling elements) and are sized conservatively to run without lubrication. Dry running ceramic bearings are becoming common in demanding applications where lubricants are not permitted for contamination reasons or because temperatures are too high. Cylindrical roller bearings have no capacity for axial loads. However, this application does not generate primary axial service loads, but small axial loads do occur due to motor misalignments and structural dynamics of the rotating system. These are for lower than the axial preload force and therefore do not adversely affect proper function of the fan system.

Ball Bearing

Ball bearing assembly 76 preferably also comprises zirconium oxide inner and outer races. It utilizes twelve silicon nitride balls with a cage made of C35000 brass. Dust shields are nickel alloy 400 (Monel 400). All materials are very fluorine compatible. The ball bearing assembly is shrink fitted into the chamber structure. The outer race 211 is clamped to the structure with metal seal 221 providing a secure clamping force of about 1600 pounds which is held in position by end cap 223.

Fan Assembly

Assembly steps for the fan are as follows:

1) Warm up chamber bottom 14A to about 100° C.
2) Install ball bearing and roller bearing outer race
3) When chamber is cool install idle shaft 201A and drive shaft 201B along with rollers and roller bearing inner race
4) Assemble rotor mounting shaft 208B, lock washer and clamp nut and assemble rotor core 208A to rotor mounting shaft
5) Push shaft 201B to the right and drop in fan blade structure 46A and bolt it in place to idle shaft 201A and drive shaft 201B
6) Assemble end cap 223 at idle end
7) Assemble stator 206 and assemble motor end cap 223.

Two Ball Bearing Design

Figure 6:
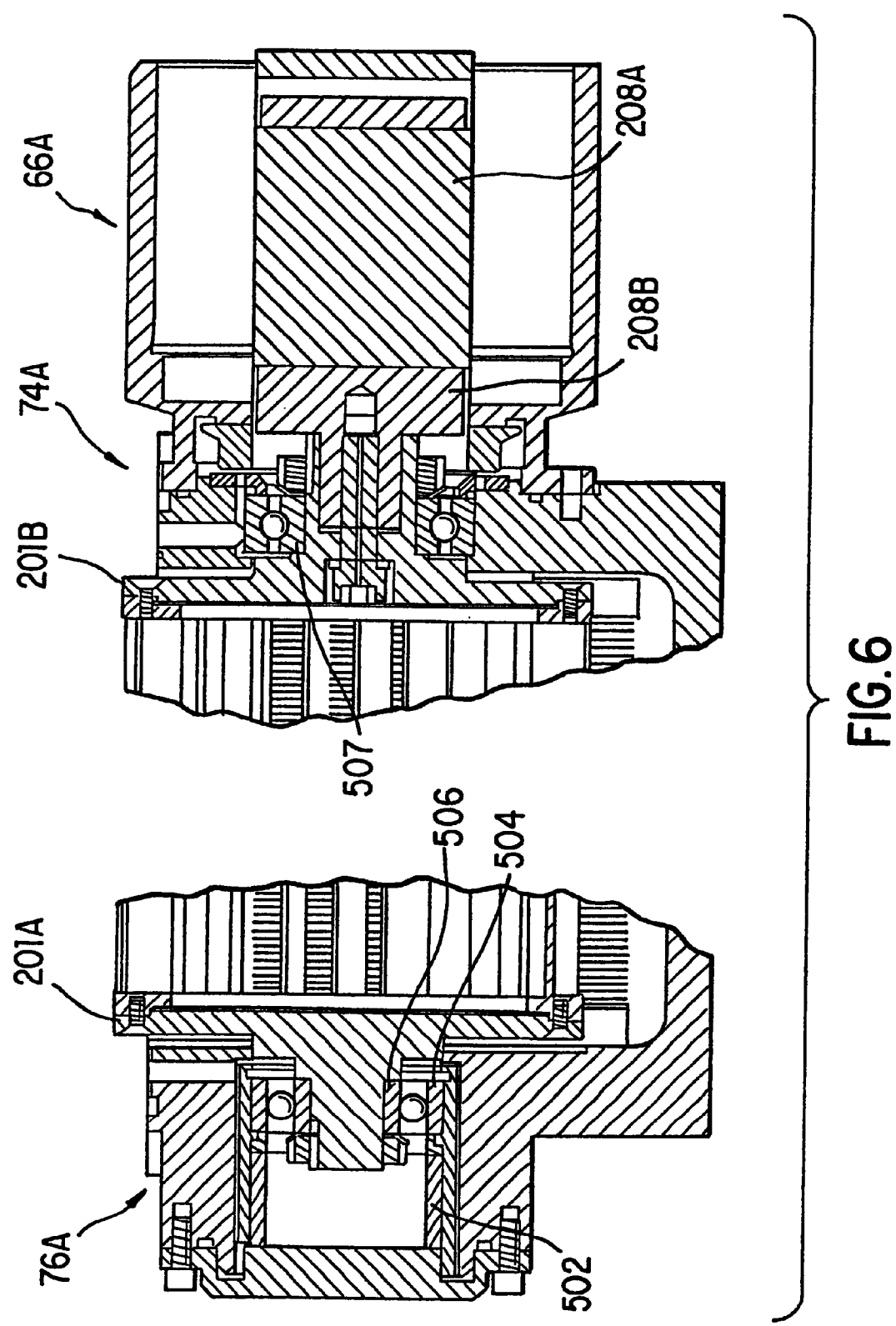
FIG. 6 shows a second fan design used in a preferred embodiment of the present invention.

A second bearing design which may be used to support the fan assembly of the present invention for 4,000 Hz to 6,000 Hz operation is shown in FIG. 6. This bearing system utilizes two angular contact ball bearings, a relatively small 20 mm shaft diameter ball bearing 76A at the idle end and a relatively larger (30 mm shaft diameter) ball bearing 74A at the drive end of the fan blade structure. The materials of the bearings are the same as for the bearings described above. The balls are $Si_3N_2$, both inner and outer races are $Zr_2O_3$. The cages in both cases are made of C35000 brass and dust shields are made of nickel alloy 400 (Monel 400). All materials are proven fluorine gas compatible. These choices of materials represent important improvements over prior art bearings for these types of lasers. These bearings have a design lifetime of several years of continuous operation. An important mode of bearing failure has been eliminated with the replacement of teflon cages with metal brass cages. In the prior art design, the teflon cages would sometimes deform under operating conditions causing immediate bearing failure. After many months of testing, Applicants have experienced no failure of the rigid brass cages and no significant wear when lubricated with PFPE lubricant Krytox 240 AC. (This lubricant is fluorine compatible.) The material C35000 is compatible with the laser gas.

As indicated in FIG. 6, the two angular contact bearing units provide both radial and axial support for the motor fan unit. At the idle end bearing cup 500 is clearance fitted into chamber wall. Spring 502 applies 20 pounds of axial preload to the outer race 504 of bearing unit 76A and permits the bearing and cup assembly to move axially in the chamber bore. Inner race 506 of bearing unit 76A is held snugly on idle shaft 201A with a lock washer and a lock nut. The 20 pounds of axial preload provided by spring 502 to outer race 504 is also transferred axially to inner race 507 of drive bearing unit 74A. Since the drive bearing is larger than the idle bearing additional axial preload is desirable. Therefore, in this embodiment rotor unit 208 of motor 66A is offset by 0.075 inch from the axial neutral position enough to provide about 10 pounds of magnetic force toward the drive so as to provide an axial pulling force on the fan shaft which adds 10 pounds to the 20 pounds provided by spring 502 to provide about 30 pounds of preload to the inner race of bearing 74A. The outer race of bearing 74A is shrink fitted into the wall of structure 14A.

The assembly process for this bearing assembly is as follows:

1) Warm chamber to approximately 100° C. and shrink fit the drive end bearing
2) Warm the bearing cup to approximately 100° C. and shrink fit the idle end bearing
3) Assemble drive shaft and motor rotor assembly and tighten and lock the clamp nut
4) Place idle shaft in bore (without bearing) and assemble fan and both shafts together
5) Assemble idle bearing and cup assembly and clamp bearing to shaft with nut
6) Fit spring and end cap
7) Assemble motor stator

Bearing Force Components

The reader should note that in the two-ball bearing design the axial preload forces applied in a so called "face to face"

configuration. This means the force acts at an angle from outer to inner race, through the balls, from the outer face of each outer race inward with respect to the chamber. This configuration is most tolerant to the effects of minor misalignment and is best suited to a rotating system with flexible elements such as our fan. The type of bearing used: angular contact, is most suitable for quiet high speed operation under axial preload due to the higher number of balls used in such bearings.

In the case of the roller bearing ball bearing combination design, of course there is no axial force acting on the roller bearing. There are angular forces, however, acting on the idle bearing produced by the radial rotating forces and the magnetic preload force due to the offsetting of the rotor relative to its magnetic neutral position within the stator. This is a deliberate low parts count, economical solution to the need to preload the bearing.

Larger Diameter Shaft

Both bearing designs discussed above permit the shaft diameter at the drive bearing to be 30 mm. Applicants have determined that this dimension is very important for good bearing lifetime and high power delivery and good motor performance. As is evident from FIGS. 5 and 6, rotor 208 held in a cantilever fashion by the two bearings at the drive end of the motor-fan shaft and it will during operation spin at more than 5,000 rpm. Therefore, the stiffness of the shaft at bearing 74 or 74A is very important. Bending stiffness scales as the fourth power of diameter so increasing the shaft diameter greatly improves stiffness. However, large diameter bearings also increases centrifugal forces on the bearing which could increase wear. This design optimizes these conflicting constraints in such a way as to provide shaft stiffness and long bearing life simultaneously.

In this embodiment, the weight of the rotor is about 1.2 pounds. Applicants have determined by computer based analysis that a shaft diameter of approximately 30 mm is the optimal compromise design specification. It is also important that a substantially perfect mate is made between drive shaft 201B and shaft adapter 208B to provide a continuous rigid shaft with a diameter equal to the inside diameter of the drive bearing and that there is minimal clearance between these two parts. With each of the two bearing embodiments, Applicants have reduced the run out measured at the end of rotor 208 to less than 0.001.

Improved Blower Motor

The power required from the blower motor rises as the cube of the inter electrode gas velocity, which scales approximately linearly with blade tip speed. For repetition rates in the range of 4 to 6 thousand pulses per second, there is a need to at least double the gas velocity as compared to the prior art 2,000 $H_z$ systems, therefore, $2^3$=8 times the power is needed.

Figure 2:
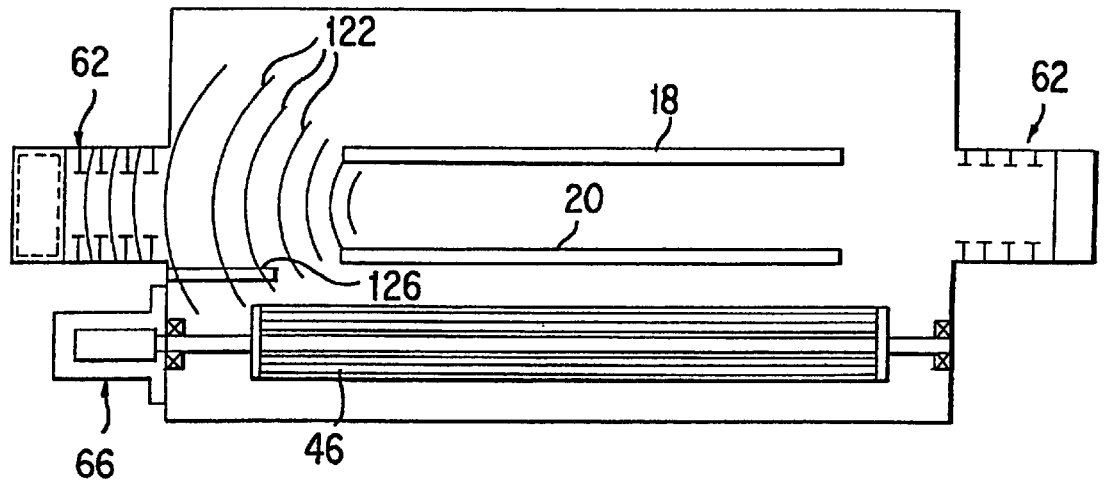
Figure 2A:
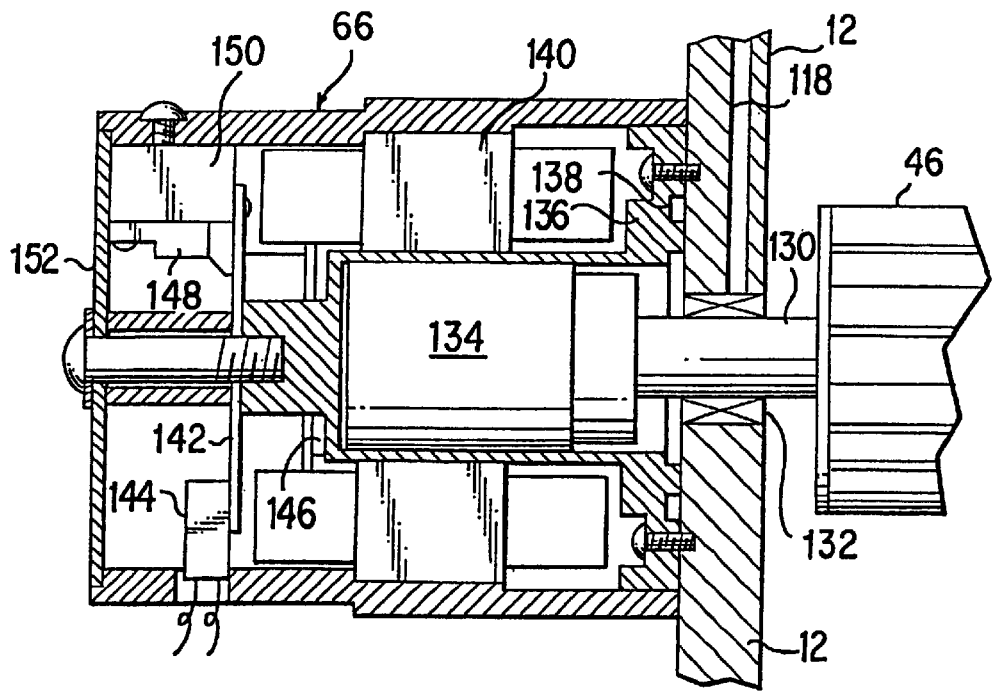
FIG. 2A shows a cross section of a part of a prior art fan system for the prior art laser.

Prior art blower motors discussed in the background section provides a nickel alloy pressure cup to separate the laser gas from the motor stator as shown at 136 in FIG. 2A. This is necessary to avoid serious gas contamination from motor materials that are not compatible with the laser gas. It is known that at 2 kHz operating levels approximately 15% of the power delivered to the rotor, significantly over 100 Watts, is dissipated as heat through the pressure wall. It is further known that these pressure wall losses scale linearly with wall thickness and as the cube of rotor diameter. For the relatively large increase in power delivered and the necessity to use a larger diameter rotor the attendant increase in pressure wall losses would be difficult to handle if current technology were merely scaled up.

Figure 6B:
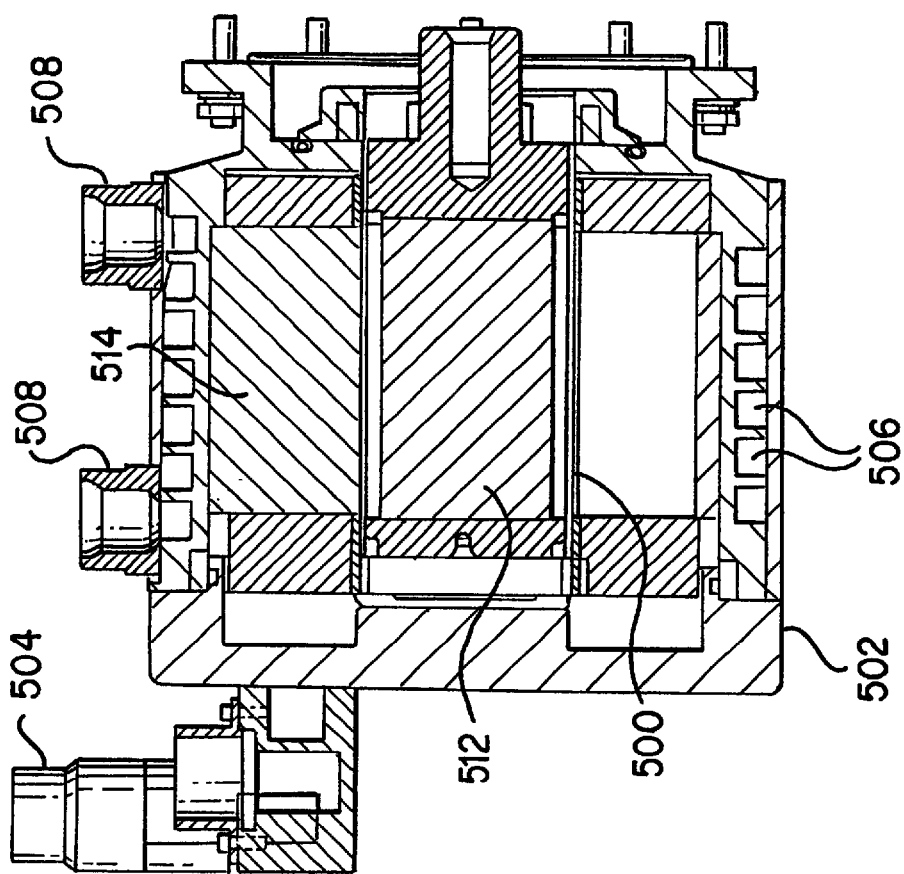
FIGS. 6A and 6B are two views of a preferred fan drive motor.
Figure 6A:
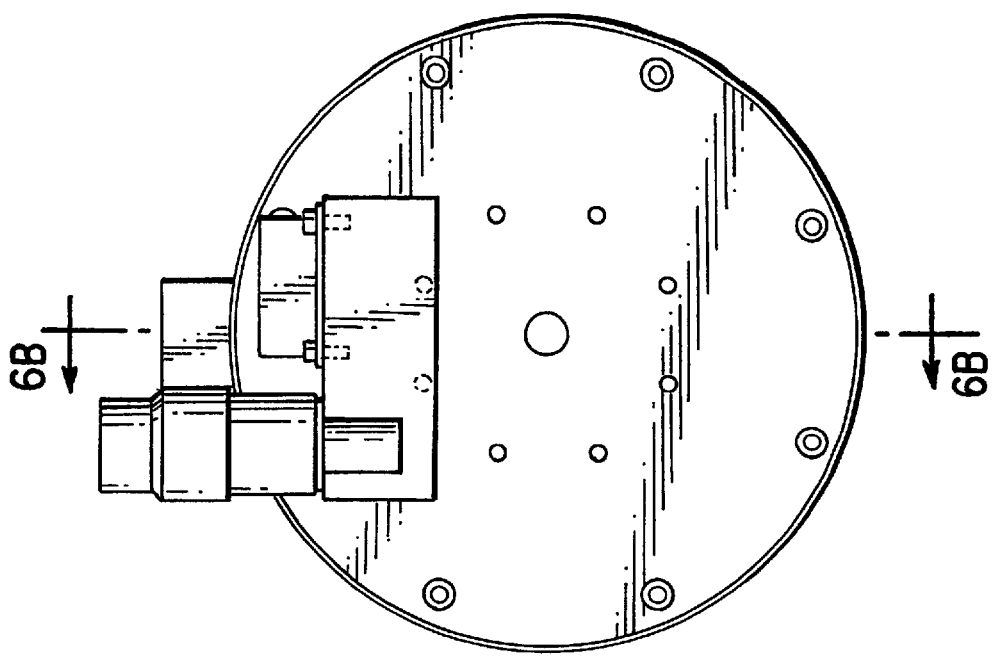

In a preferred embodiment of the present invention, the thickness of the pressure wall is reduced to 0.005 inch (shown in FIG. 6B as an extremely thin line at 500) compared with the greater than 0.030 inch in the prior art motor. In this preferred embodiment rotor diameter is kept relatively small so that the pressure cup can be as small as feasible on the unit is aggressively cooled to maintain an acceptable outer surface temperature. This design results in pressure wall losses of only 167 W at 5000 rpm and total motor losses of just over 400 W with a skin temperature close to the laser enclosure ambient of 35° C.

Important advantages of the motor are:

It enables laser repetition rates of up to 6 kHz by delivering at least 4.5 kW of shaft power at 5000 rpm.

Minimized total motor losses for acceptable thermal management at high power levels.

All surfaces exposed to the laser gas are compatible with the gas mixture resulting in no impact to laser gas life or performance.

It fits in a tightly constrained space within the laser enclosure without interference with other modules and equipment.

It maintains a skin temperature of less than 35° C., which is very important due to its proximity to the output coupler optic of the laser.

The motor is a 4.5 kW laser gas blower motor with the following features:

Six-pole, brushless DC motor 5.5" in diameter and 5" in length.

Total motor losses of less than 450 W achieved by using 0.005 inch pressure wall made from laser gas compatible materials such as monel 400 or Ti-6A1— 4V titantium or inconel 718 or 300 series stainless steel Six-pole rotor with friction and laser welded construction that results in all laser gas wetted surfaces being made from gas compatible materials (in this case monel 400)

Water cooled stainless steel housing with helical water channel.

Since the pressure cup protecting the stater from the laser gas is so thin and since the fluorine gas in the chamber is hazardous, applicants have designed the motor to deal with this potential hazard. An outer motor housing 502 surrounding the starter provides a welded sealed outer containment which completely traps the laser gas in the event of a rupture of cup 500. The motor design includes a pressure detector 504 which in the preferred embodiment energizes a warning signal and de-energizes the motor in the event of a failure of cup 500.

Cooling of this motor is provided by helical coils 506 machined into the motor housing 502. The parts of the housing are welded to perform a sealed unit. Water inlet and outlet connections 508 are also welded on to the housing forming seals at these joints. The DC power connection is shown at 510. The unit is powered by a standard off the shelf DC power source not shown. The motor in this unit is shown at 512 and the starter at 514.

Other Cup Materials

Other materials may be used for the pressure cup. The materials may be chosen to keep heat losses as low as feasible. Even ceramic materials aluminum oxide may be used since the sealed outer containment protects against the possibility of pressure cup rupture.

In an alternate embodiment the motor is cooled by a water cooled copper cold plate.

Pulse Power

Four to Six Thousand Hz Pulse Power System

Operation of laser systems in accordance with the present invention requires precisely controlled electrical potentials in the range of about 12,000 V to 20,000 V be applied between the electrodes at 6,000 Hz (i.e., at intervals of about 166 micro seconds). As indicated in the background section, in prior art pulse power systems a charging capacitor bank is charged to a precisely predetermined control voltage and the discharge is produced by closing a solid state switch which allows the energy stored on the charging capacitor to ring through a compression-amplification circuit to produce the desired potential across the electrodes. The time between the closing of the switch to the completion of the discharge is only a few microseconds, (i.e., about 5 microseconds) but the charging of $C_0$ required a time interval much longer than 166 microseconds. It is possible to reduce the charging time by using a larger power supply. Alternatively, using power supplies in parallel can reduce the charging time. For example, Applicants have been able to operate at 4,000 Hz using three prior art power supplies arranged in parallel.

Figure 3:
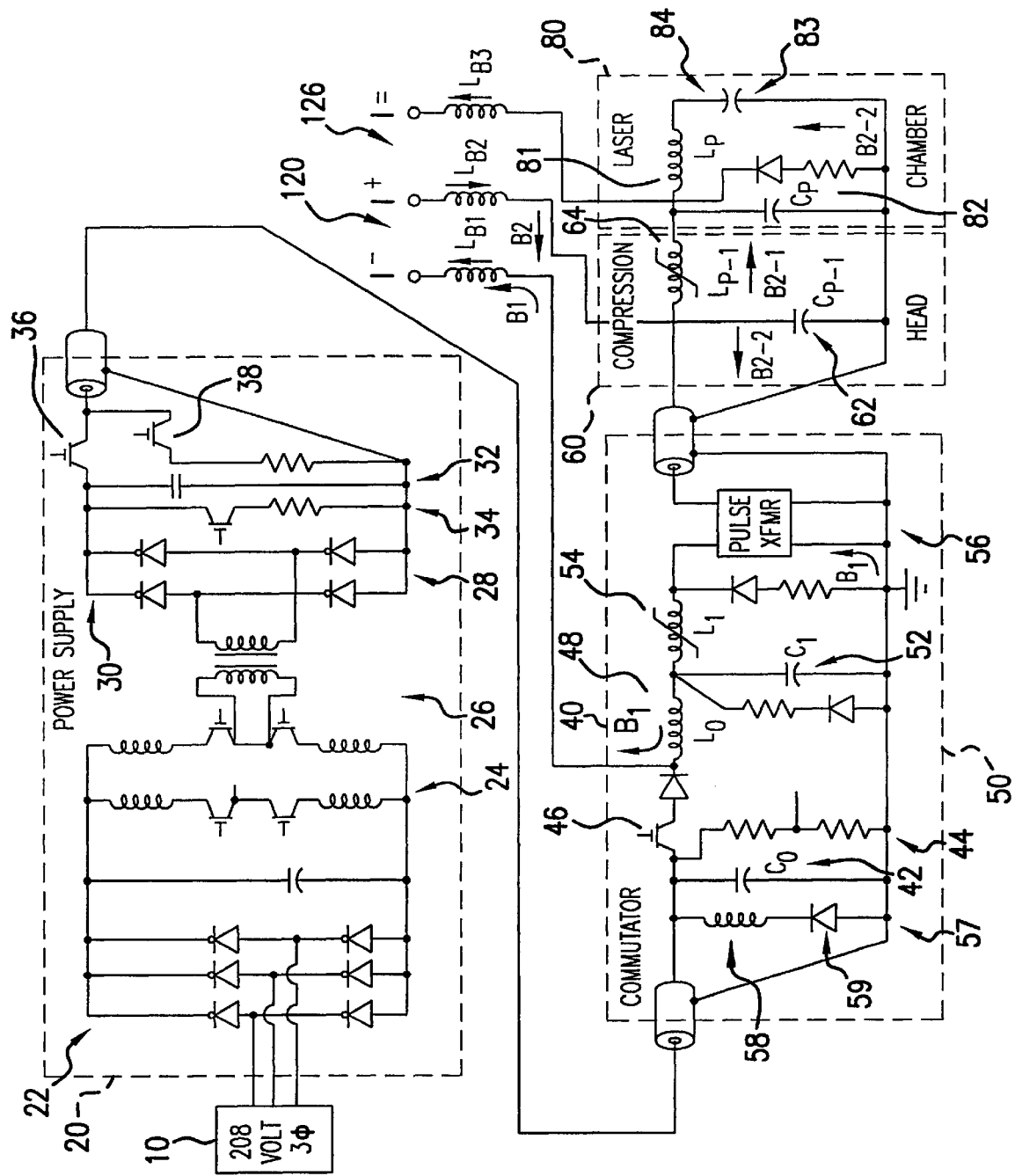
FIG. 3 shows a circuit diagram of a prior art pulse power system.

In this preferred embodiment, Applicants utilize the same basic design as in the prior art shown in FIG. 3 for the portion of the pulse power system downstream of the solid state switch, but Applicants utilize a radically different technique for charging $C_0$.

Resonant Charging

Applicants have utilized two types of resonant charging systems for very fast charging of $C_0$. These systems can be described by reference to FIGS. 7A and 7B.

First Resonant Charger

Figure 7A:
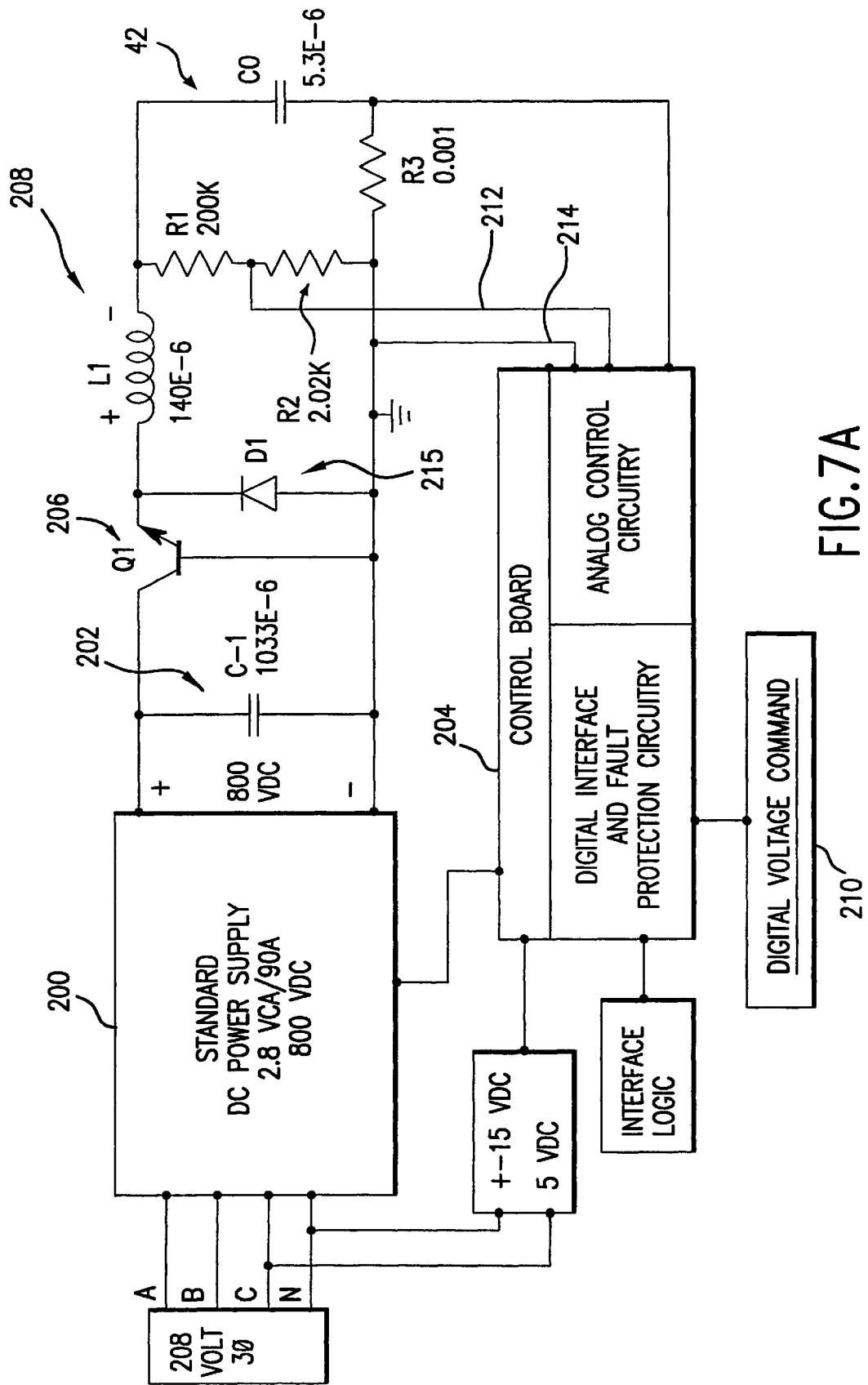
FIG. 7A shows a first preferred resonant charger design.

An electrical circuit showing this preferred embodiment is shown in FIG. 7A. In this case, a standard dc power supply 200 having a 208 VAC/90 amp input and an 800 VDC 50 amp output is used. The power supply is a dc power supply adjustable from approximately 600 volts to 800 volts. The power supply is attached directly to C-1 eliminating the need for voltage feedback to the supply. When the supply is enabled it turns on and regulates a constant voltage on C-1 capacitor. The performance of the system is somewhat independent of the voltage regulation on C-1 therefore only the most basic control loop is necessary in the power supply. Secondly the supply will be adding energy into the system whenever the voltage on C-1 falls below the voltage setting. This allows the power supply the entire time between laser pulse, (and even during laser pulses), to replenish energy transferred from C-1 to $C_0$. This further reduces the power supply peak current requirements over the prior art pulse power systems described earlier. The combination of requiring a supply with the most basic control loop, and minimizing the peak current rating of the supply to the average power requirements of the system reduces the power supply cost an estimated 50%. Additionally this preferred design provides vendor flexibility since constant current, fixed output voltage power supplies are readily available from multiple sources. Such power supplies are available from suppliers such as Elgar, Universal Voltronics, Kaiser and EMI. This power supply continuously charges a 1033 $\mu F$ capacitor 202 to the voltage level commanded by the control board 204. The control board 204 also commands IGBT switch 206 closed and open to transfer energy from capacitor 202 to capacitor 42. Inductor 208 sets up the transfer time constant in conjunction with capacitor 202 and 42 and limits the peak charging current. Control board 204 receives a voltage feedback 212 that is proportional to the voltage on capacitor 42 and a current feedback 214 that is proportional to the current flowing through inductor 208. From these two feedback signals control board 204 can calculate in real time the final voltage on capacitor 42 should IGBT switch 206 open at that instant of time. Therefore with a command voltage 210 fed into control board 204 a precise calculation can be made of the stored energy within capacitor 42 and inductor 208 to compare to the required charge voltage commanded 210. From this calculation, the control board 204 will determine the exact time in the charge cycle to open IGBT switch 206.

After IGBT switch 206 opens the energy stored in the magnetic field of inductor 208 will transfer to capacitor 42 through the free-wheeling diode path 215. The accuracy of the real time energy calculation will determine the amount of fluctuation dither that will exist on the final voltage on capacitor 42. Due to the extreme charge rate of this system, too much dither may exist to meet a desired systems regulation need of ±0.05%. Therefore additional information to the circuit may be required, such as for example, a de-qing circuit or a bleed-down circuit as discussed below.

Second Resonant Charger

Figure 7B:
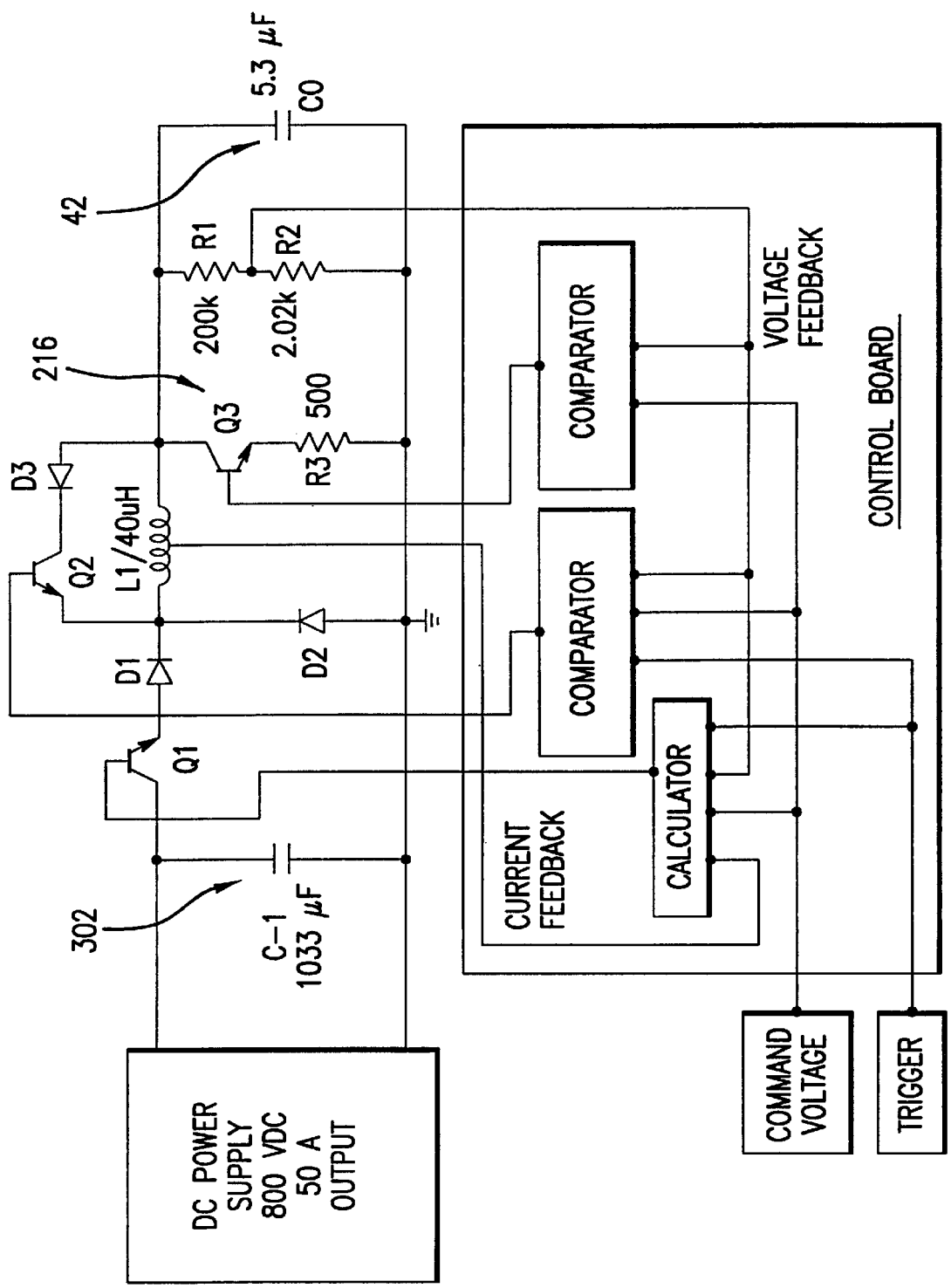
FIG. 7B shows a second preferred resonant charger design.

A second resonant charger system is shown in FIG. 7B. This circuit is similar to the one shown in FIG. 7A. The principal circuit elements are:

I1—A three-phase power supply 300 with a constant DC current output.

C-1—A source capacitor 302 that is an order of magnitude or more larger than the existing C0 capacitor 42.

Q1, Q2, and Q3—Switches to control current flow for charging and maintaining a regulated voltage on $C_0$.

D1, D2, and D3—Provides current single direction flow.

R1, and R2—Provides voltage feedback to the control circuitry.

R3—Allows for rapid discharge of the voltage on $C_0$ in the event of a small over charge.

L1—Resonant inductor between C-1 capacitor 302 and $C_0$ capacitor 4-2 to limit current flow and setup charge transfer timing.

Control Board 304—Commands Q1, Q2, and Q3 open and closed based upon circuit feedback parameters.

An example of operation is as follows:

The difference in the circuit of FIG. 7B from that of 7A is the addition of switch Q2 and diode D3, known as a De-Qing switch. This switch improves the regulation of the circuit by allowing the control unit to short out the inductor during the resonant charging process. This "de-qing" prevents additional energy stored in the current of the charging inductor, L1, from being transferred to capacitor $C_0$.

Prior to the need for a laser pulse the voltage on C-1 is charged to 600–800 volts and switches Q1–Q3 are open. Upon command from the laser, Q1 would close. At this time current would flow from C-1 to $C_0$ through the charge inductor L1. As described in the previous section, a calculator on the control board would evaluate the voltage on $C_0$ and the current flowing in L1 relative to a command voltage set point from the laser. Q1 will open when the voltage on $C_0$ plus the equivalent energy stored in inductor L1 equals the desired command voltage. The calculation is:

$$V_f = [V_{C0s}^2 + ((L_1 * I_{L1s}^2)/C_0)]^{0.5}$$

Where:

$V_f$=The voltage on $C_0$ after Q1 opens and the current in L1 goes to zero.

$V_{C0s}$=The voltage on $C_0$ when Q1 opens.

$I_{L1s}$=The current flowing through $L_1$ when Q1 opens.

After Q1 opens the energy stored in L1 starts transferring to $C_0$ through D2 until the voltage on $C_0$ approximately equals the command voltage. At this time Q2 closes and current stops flowing to $C_0$ and is directed through D3. In addition to the "de-qing" circuit, Q3 and R3 from a bleed-down circuit to allow additional fine regulation of the voltage on $C_0$.

Switch Q3 of bleed down circuit 216 will be commanded closed by the control board when current flowing through inductor L1 stops and the voltage on C0 will be bled down to the desired control voltage; then switch Q3 is opened. The time constant of capacitor $C_0$ and resistor R3 should be sufficiently fast to bleed down capacitor $C_0$ to the command voltage without being an appreciable amount of the total charge cycle.

As a result, the resonant charger can be configured with three levels of regulation control. Somewhat crude regulation is provided by the energy calculator and the opening of switch Q1 during the charging cycle. As the voltage on $C_0$ nears the target value, the de-qing switch is closed, stopping the resonant charging when the voltage on $C_0$ is at or slightly above the target value. Finally, as a third control over the voltage regulation the bleed-down circuit of switch Q3 and R3 can be used to discharge $C_0$ down to the precise target value.

Improvements Downstream of $C_0$

As indicated above, the pulse power system of the present invention utilizes the same basic design as was used in the prior art systems described in FIG. 3. However, some significant improvements in that basic design were required for the approximate factor of 3 increase in heat load resulting from the greatly increased repetition rate. These improvements are discussed below.

Detailed Commutator and Compression Head Description

The principal components of commutator 40 and compression head 60 are shown in FIG. 3 and are discussed in the Background section with regard to the operation of the system. In this section, we describe details of fabrication of the commutator and the compression head.

Solid State Switch

Solid state switch 46 is an P/N CM 800 HA-34H IGBT switch provided by Powerex, Inc. with offices in Youngwood, Pa. In a preferred embodiment, two such switches are used in parallel.

Inductors

Inductors 48, 54 and 64 are saturable inductors similar to those used in prior systems as described in U.S. Pat. Nos. 5,448,580 and 5,315,611.

Figure 13:
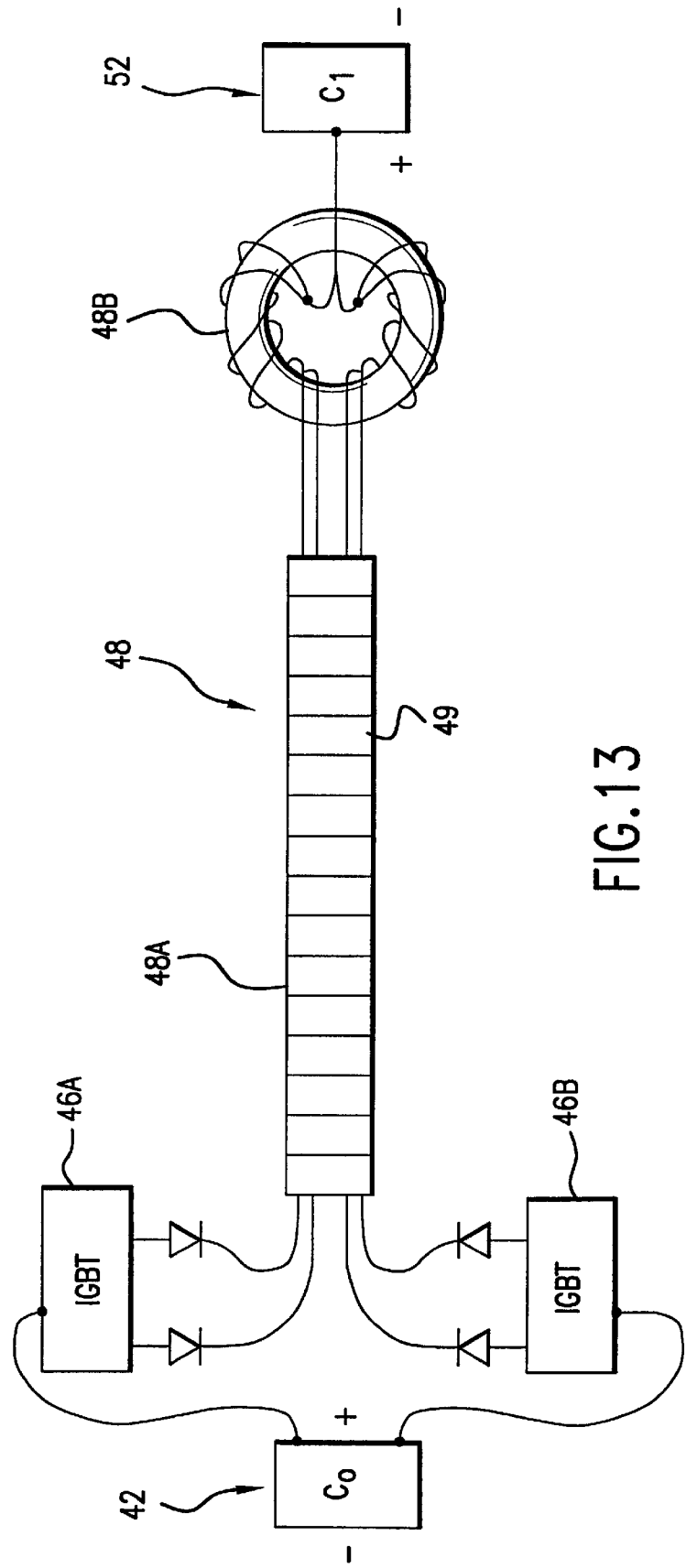
FIG. 13 shows a portion of a preferred pulse power system.

FIG. 13 shows a preferred design of the $L_0$ inductor 48. In this inductor four conductors from the two IGBT switches 46B pass through sixteen ferrite toroids 49 to form part 48A an 8 inch long hollow cylinder of very high permeability material with an ID of about 1 inch and an Od of about 1.5 inch. Each of the four conductors are then wrapped twice around an insulating doughnut shaped core to form part 48B. The four conductors then connect to a plate which is in turn connected to the high voltage side of the $C_1$ capacitor bank 52.

Figure 14:
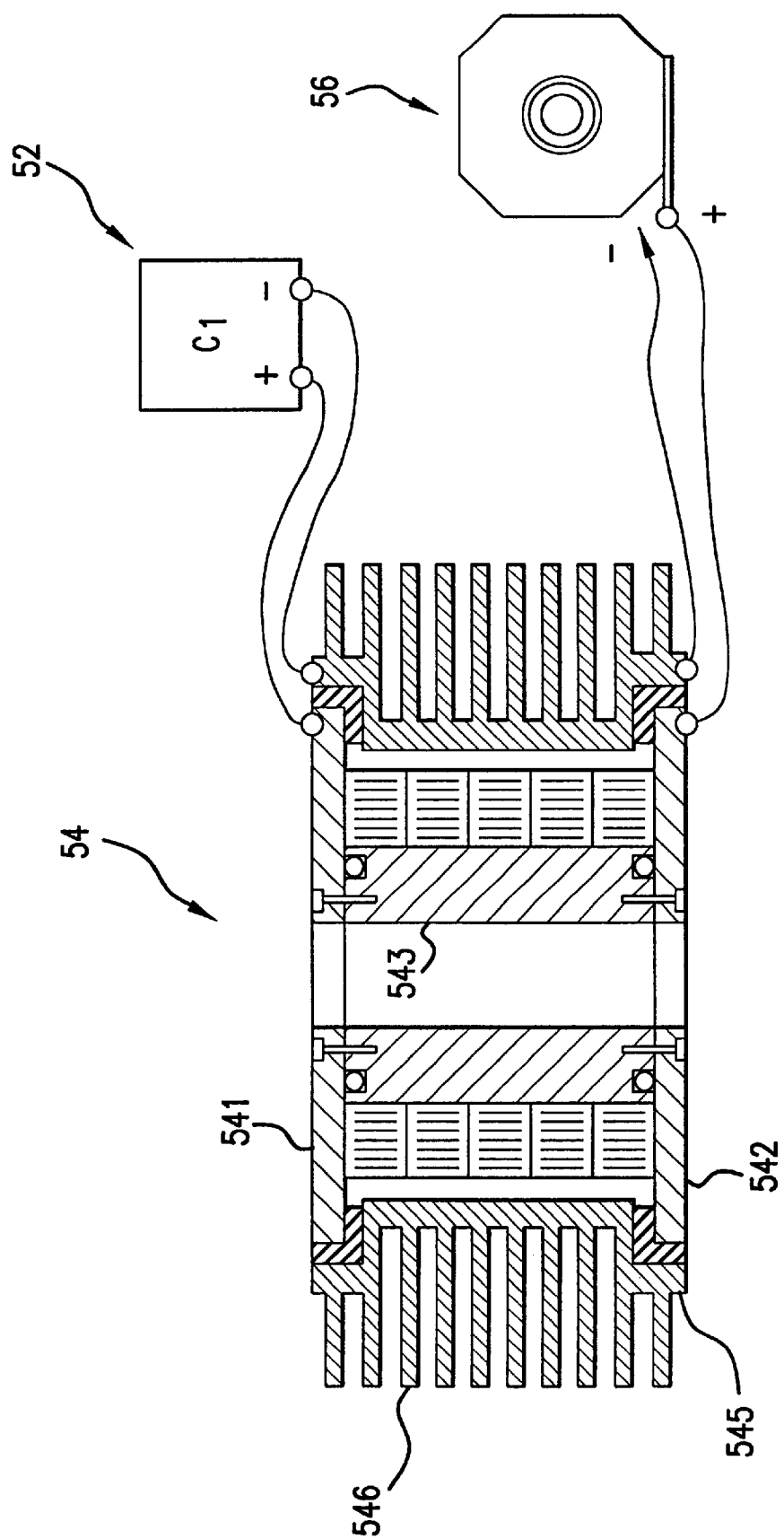
FIG. 14 shows an air cooled saturable inductor.

A preferred sketch of saturable inductor 54 is shown in FIG. 14. In this case, the inductor is a single turn geometry where the assembly top and bottom lids 541 and 542 and center mandrel 543, all at high voltage, form the single turn through the inductor magnetic cores. The outer housing 545 is at ground potential. The magnetic cores are 0.0005" thick tape wound 50-50% Ni—Fe alloy provided by Magnetics of Butler, Pa. or National Arnold of Adelanto, Calif. Fins 546 on the inductor housing facilitate transfer of internally dissipated heat to forced air cooling. In addition, a ceramic disk (not shown) is mounted underneath the reactor bottom lid to help transfer heat from the center section of the assembly to the module chassis base plate. FIG. 14 also shows the high voltage connections to one of the capacitors of the $C_1$ capacitor bank 52 and to a high voltage lead on one of the induction units of the 1:25 step up pulse transformer 56. The housing 545 is connected to the ground lead of unit 56.

Figure 8A:
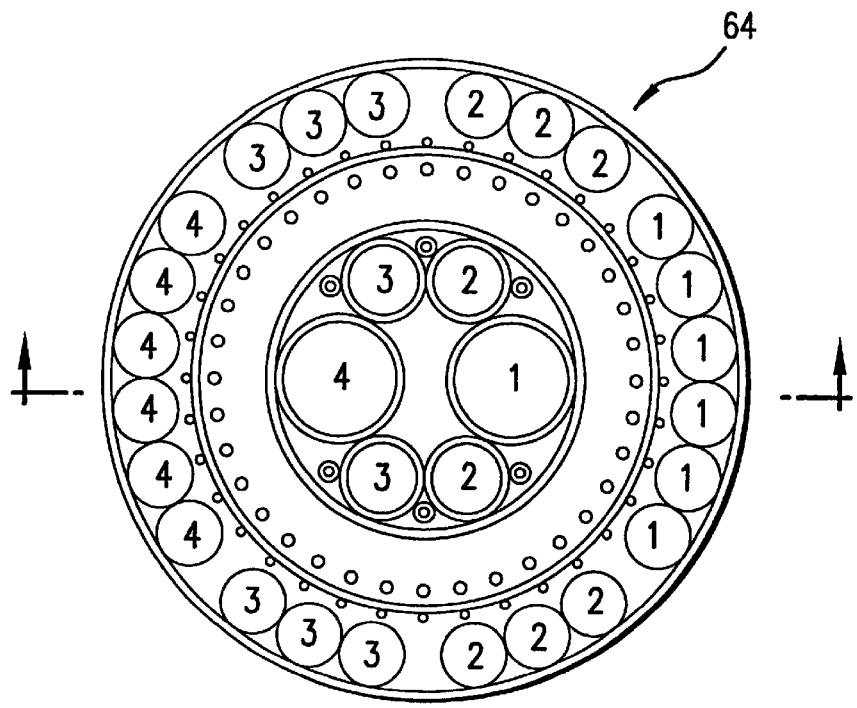
FIGS. 8A and 8B show cross section views of a first saturable inductor.
Figure 8B:
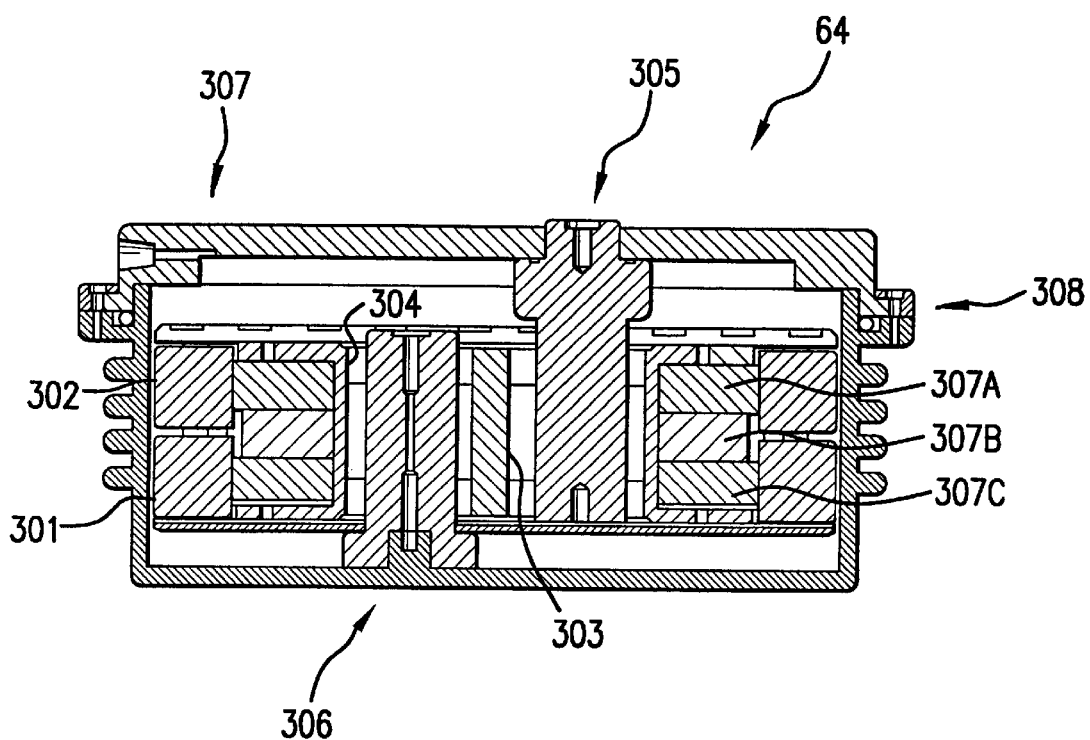
Figure 9:
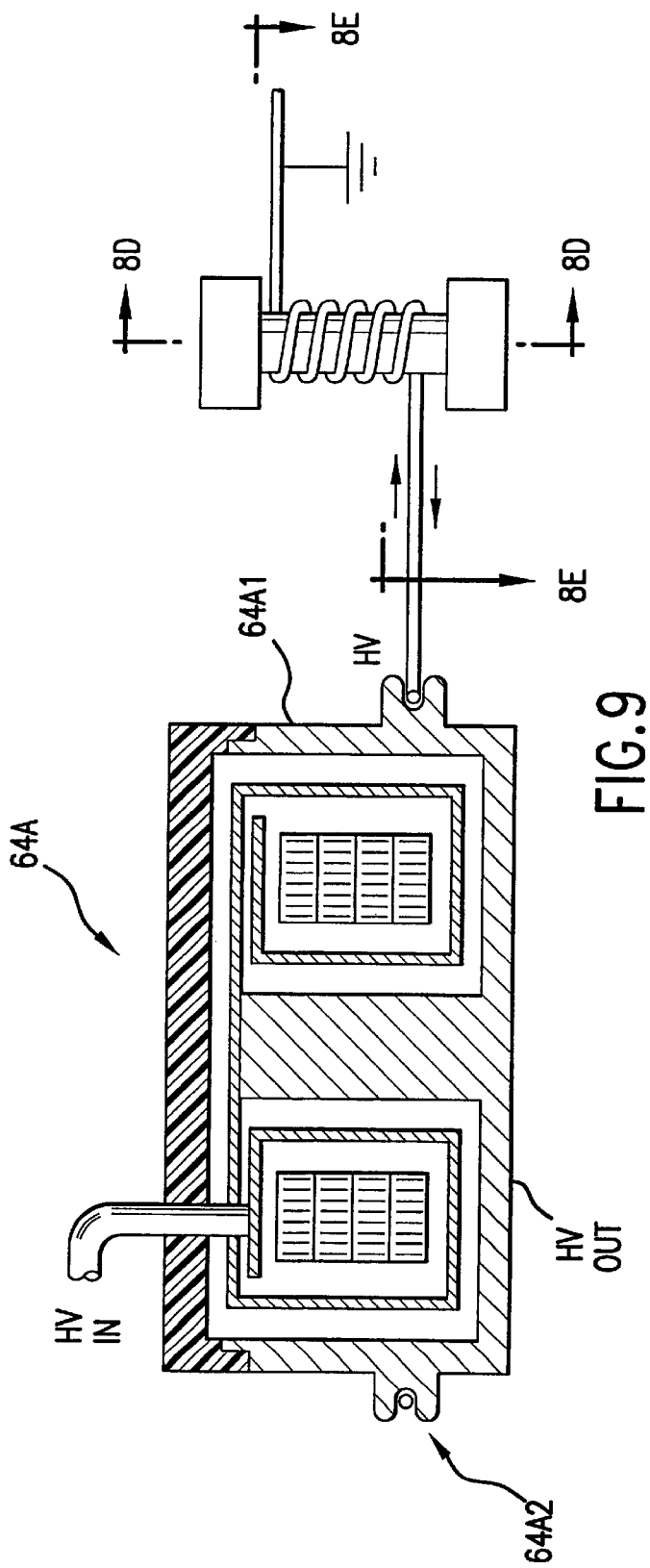
FIGS. 9, 10 and 11 are drawings describing a water cooled saturable inductor.
Figure 11:
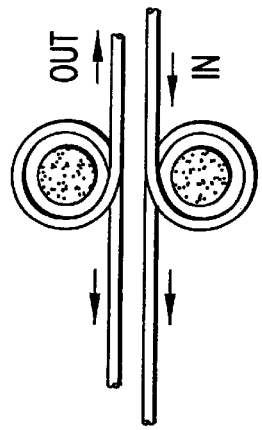
Figure 10:
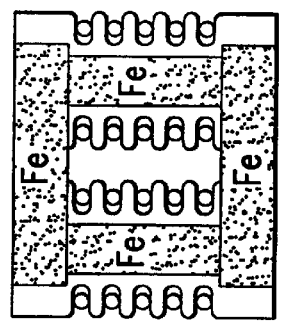
Figure 12:
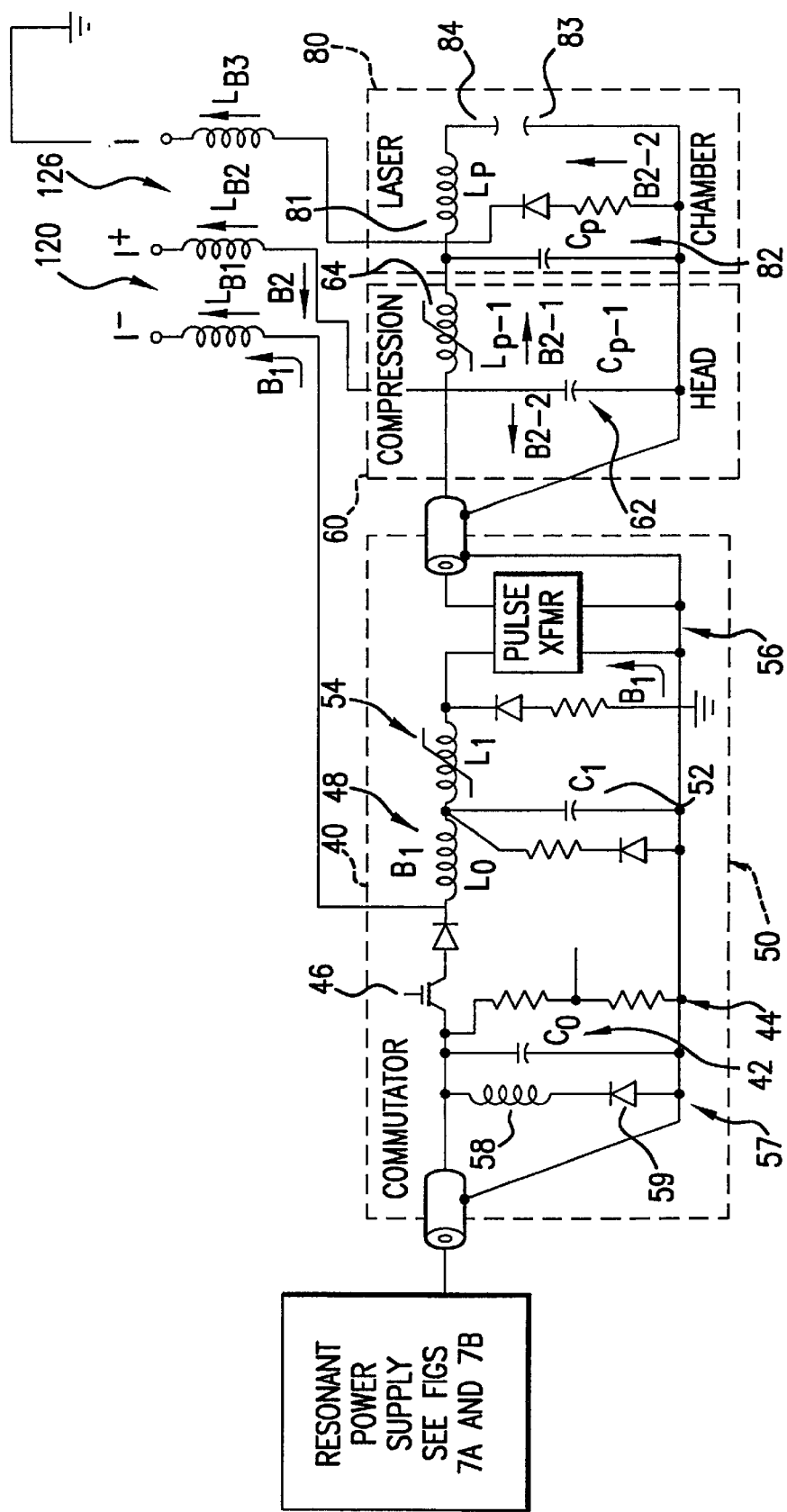
FIG. 12 shows a circuit diagram of a preferred pulse power system.

A top and section view of the saturable inductor 64 is shown respectively in FIGS. 8A and 8B. In the inductors of this embodiment, flux excluding metal pieces 301, 302, 303 and 304 are added as shown in FIG. 8B in order to reduce the leakage flux in the inductors. These flux excluding pieces substantially reduce the area which the magnetic flux can penetrate and therefore help to minimize the saturated inductance of the inductor. The current makes five loops through vertical conductor rods in the inductor assembly around magnetic core 307. The current enters at 305 travels down a large diameter conductor in the center labeled "1" and up six smaller conductors on the circumference also labeled "1" as shown in FIG. 8A. The current then flows down two conductors labeled 2 on the inside, then up the six conductors labeled 2 on the outside then down flux exclusion metal on the inside then up the six conductors labeled 3 on the outside, then down the two conductors labeled 3 on the inside, then up the six conductors labeled 4 on the outside, then down the conductor labeled 4 on the inside. The flux exclusion metal components is held at half the full pulsed voltage across the conductor allowing a reduction in the safe hold-off spacing between the flux exclusion metal parts and the metal rods of the other turns. The magnetic core 307 is made up of three coils 307A, B and C formed by windings of 0.0005" thick tape 80-20% Ni—Fe alloy provided by Magnetics, Inc. of Butler, Pa. or National Arnold of Adelanto, Calif.

In prior art pulse power systems, oil leakage from electrical components has been a potential problem. In this preferred embodiment, oil insulated components are limited to the saturable inductors. Furthermore, the saturable inductor as shown in FIG. 8B are housed in a pot type oil containing housing in which all seal connections are located above the oil level to substantially eliminate the possibility of oil leakage. For example, the lowest seal in inductor 64 is shown at 308 in FIG. 8B. Since the normal oil level is below the top lip of the housing 306, it is almost impossible for oil to leak outside the assembly as long as the housing is maintained in an upright condition.

Capacitors

Capacitor banks 42, 52 and 62 are all comprised of banks of off-the-shelf capacitors connected in parallel. Capacitors 42 and 52 are film type capacitors available from suppliers such as Vishay Roederstein with offices in Statesville, N.C. or Wima of Germany. Applicants preferred method of connecting the capacitors and inductors is to solder them to positive and negative terminals on special printed circuit board having heavy nickel coated copper leads in a manner similar to that described in U.S. Pat. No. 5,448,580. Capacitor bank 62 is typically composed of a parallel array of high voltage ceramic capacitors from vendors such as Murata or TDK, both of Japan. In a preferred embodiment for use on an ArF laser, $C_p$ is comprised of a bank of thirty three 0.3 nF capacitors for a capacitance of 9.9 nF; $C_{p-1}$ is comprised of a bank of sixteen 0.59 nF capacitors for a total capacitance of 9.1 nF; $C_1$ is a 6.3 $\mu$F capacitor bank and $C_0$ is a 6 $\mu$F capacitor bank.

Pulse Transformer

Figure 15:
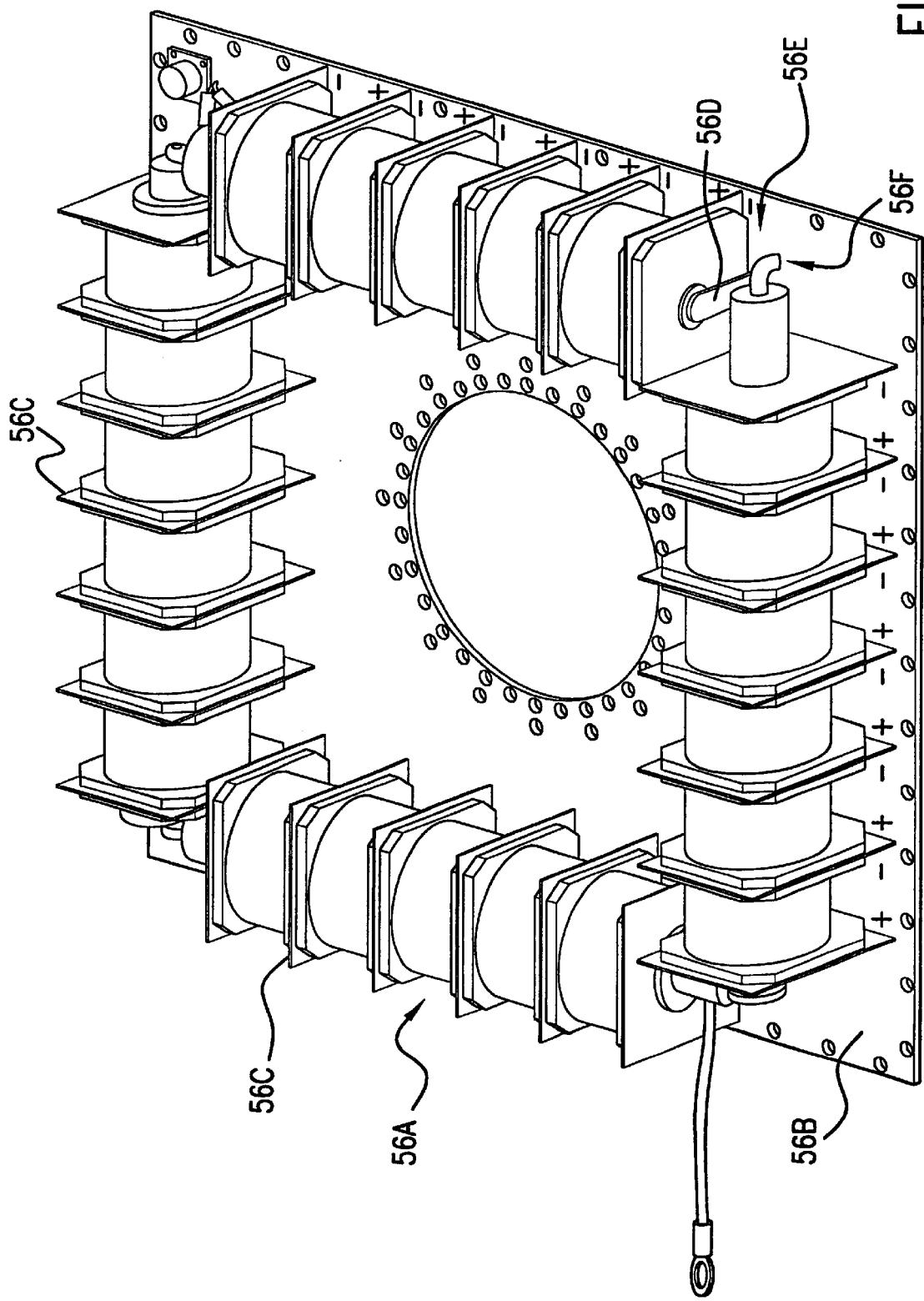
FIG. 15 is a drawing of a pulse transformer.
Figure 15A:
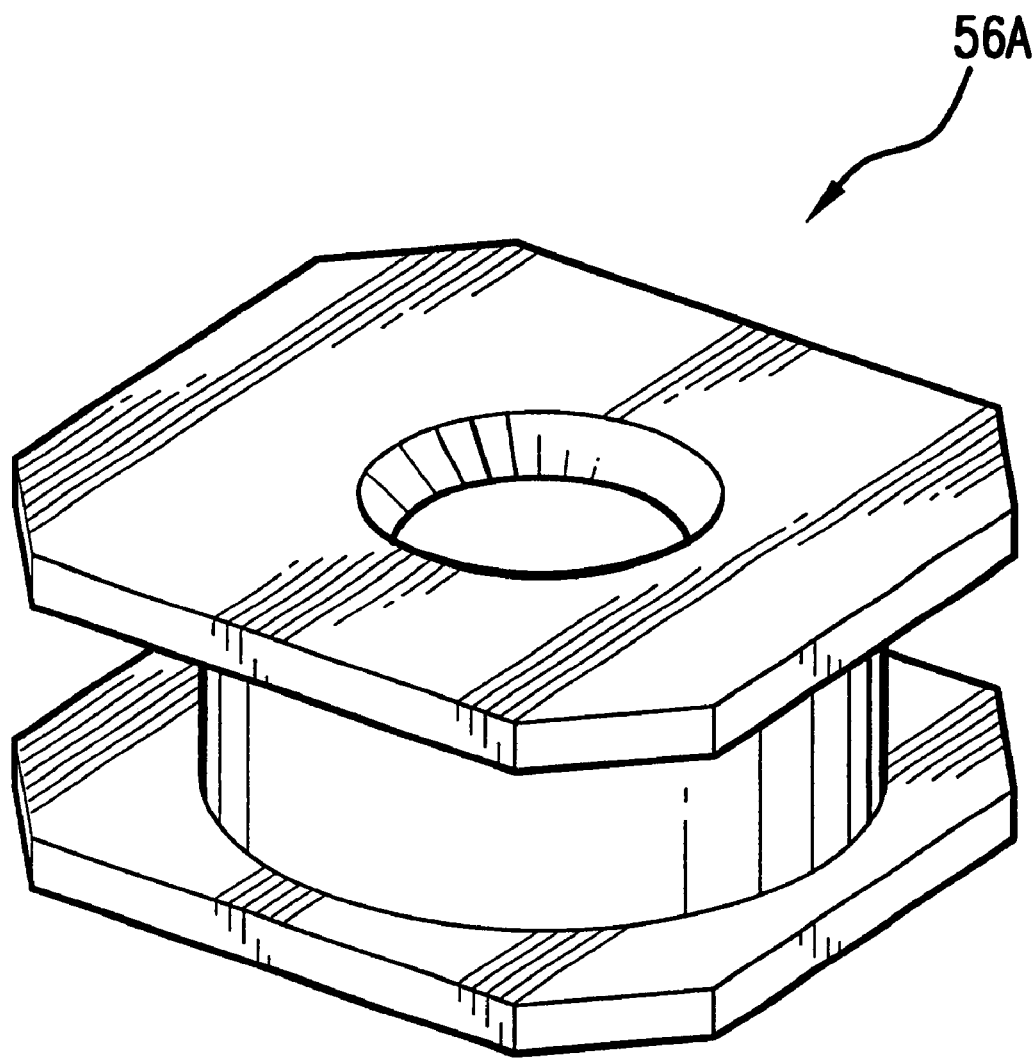

Pulse transformer 56 is also similar to the pulse transformer described in U.S. Pat. Nos. 5,448,580 and 5,313,481; however, the pulse transformers of the present embodiment has only a single turn in the secondary winding and 24 induction units equivalent to 1/24 of a single primary turn for an equivalent step-up ratio of 1:24. A drawing of pulse transformer 56 is shown in FIG. 15. Each of the 24 induction units comprise an aluminum spool 56A having two flanges (each with a flat edge with threaded bolt holes) which are bolted to positive and negative terminals on printed circuit board 56B as shown along the bottom edge of FIG. 15. (The negative terminals are the high voltage terminals of the twenty four primary windings.) Insulators 56C separates the positive terminal of each spool from the negative terminal of the adjacent spool. Between the flanges of the spool is a hollow cylinder 1 1/16 inches long with a 0.875 OD with a wall thickness of about 1/32 inch. The spool is wrapped with one inch wide, 0.7 mil thick Metglas™ 2605 S3A and a 0.1 mil thick mylar film until the OD of the insulated Metglas™ wrapping is 2.24 inches. A prospective view of a single wrapped spool forming one primary winding is shown in FIG. 15A.

The secondary of the transformer is a single OD stainless steel rod mounted within a tight fitting insulating tube of PTFE. The winding is in four sections as shown in FIG. 15. The low voltage end of stainless steel secondary shown as 56D in FIG. 15 is tied to the primary HV lead on printed circuit board 56B at 56E, the high voltage terminal is shown at 56F. As a result, the transformer assumes an auto-transformer configuration and the step-up ratio becomes 1:25 instead of 1:24. Thus, an approximately −1400 volt pulse between the + and − terminals of the induction units will produce an approximately −35,000 volt pulse at terminal 56F on the secondary side. This single turn secondary winding design provides very low leakage inductance permitting extremely fast output rise time.

Details of Laser Chamber Electrical Components

Figure 1:
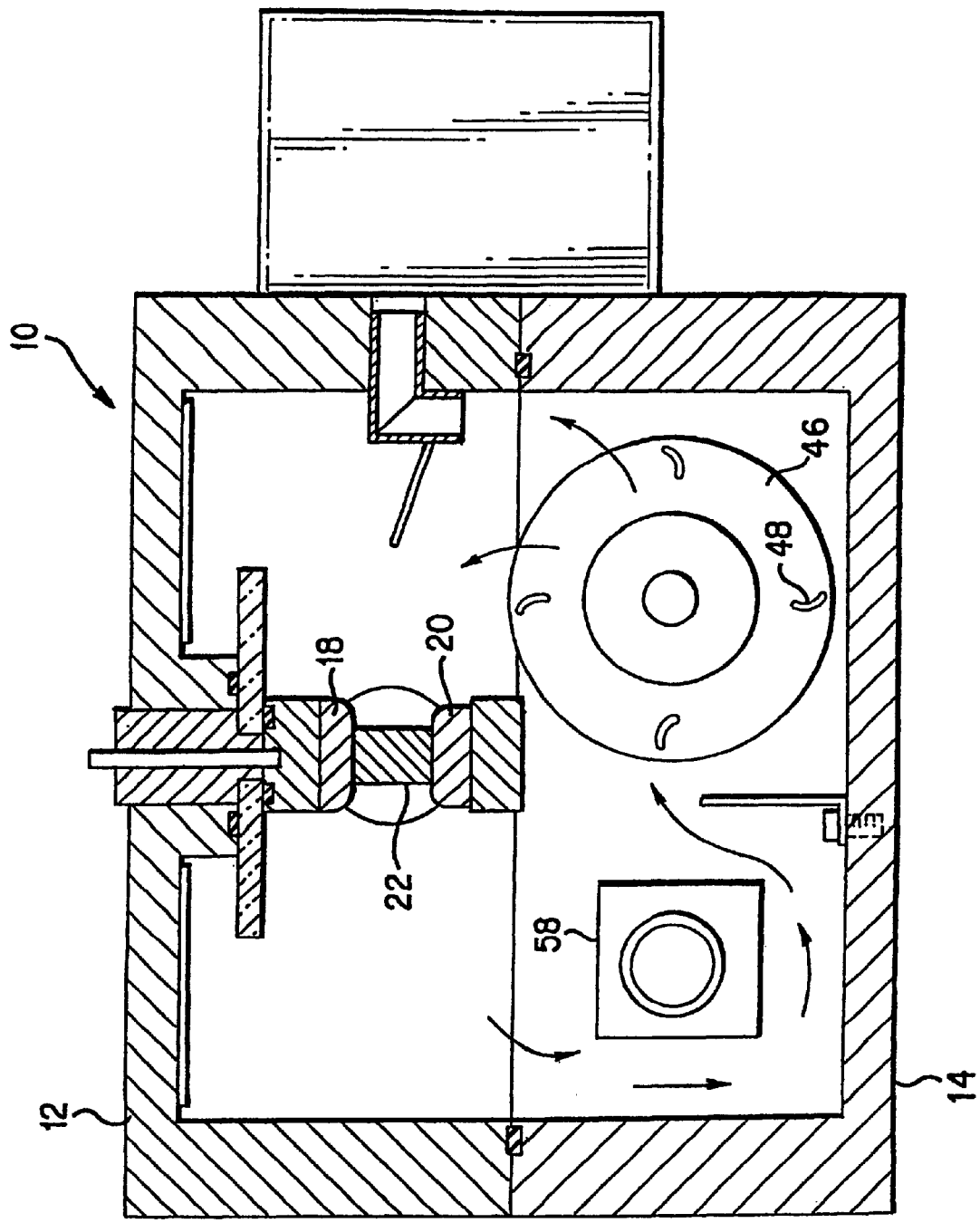
FIGS. 1 and 2 show a cross section drawings of a prior art laser chamber.

The Cp capacitor 82 is comprised of a bank of twenty 0.59 nf capacitors mounted on top of the chamber pressure vessel. (Typically a KrF laser is operated with a lasing gas made up of 1.0% krypton, 0.1% fluorine, and the remainder neon.) The electrodes are each solid brass bars about 28 inches long which are separated by about 0.5 to 1.0 inch preferably about 5/8 inch. In this embodiment, the top electrode is the cathode and the bottom electrode is connected to ground as indicated in FIG. 1.

Water Cooling of Components

To accommodate greater heat loads an alternate embodiment is presented here which is better able to support operation at this higher average power mode by using water cooling in addition to the normal forced air cooling provided by cooling fans.

One disadvantage of water cooling has traditionally been the possibility of a leak occurring in the module around the components or wiring that is exposed to high voltage. This specific embodiment avoids that potential issue by utilizing a single solid piece of cooling tubing that is routed within the module to cool those components that normally dissipate the majority of the heat deposited in the module.

Since no joints or connections exist inside the module enclosure and the cooling tubing is a continuous piece of solid metal (e.g. copper, stainless steel, etc.), the chances of a leak occurring are greatly diminished. Module connections to the cooling water are therefore made outside the assembly sheet metal enclosure where the cooling tubing mates with a quick-disconnect type connector.

Detailed Commutator Description

Figure 14A:
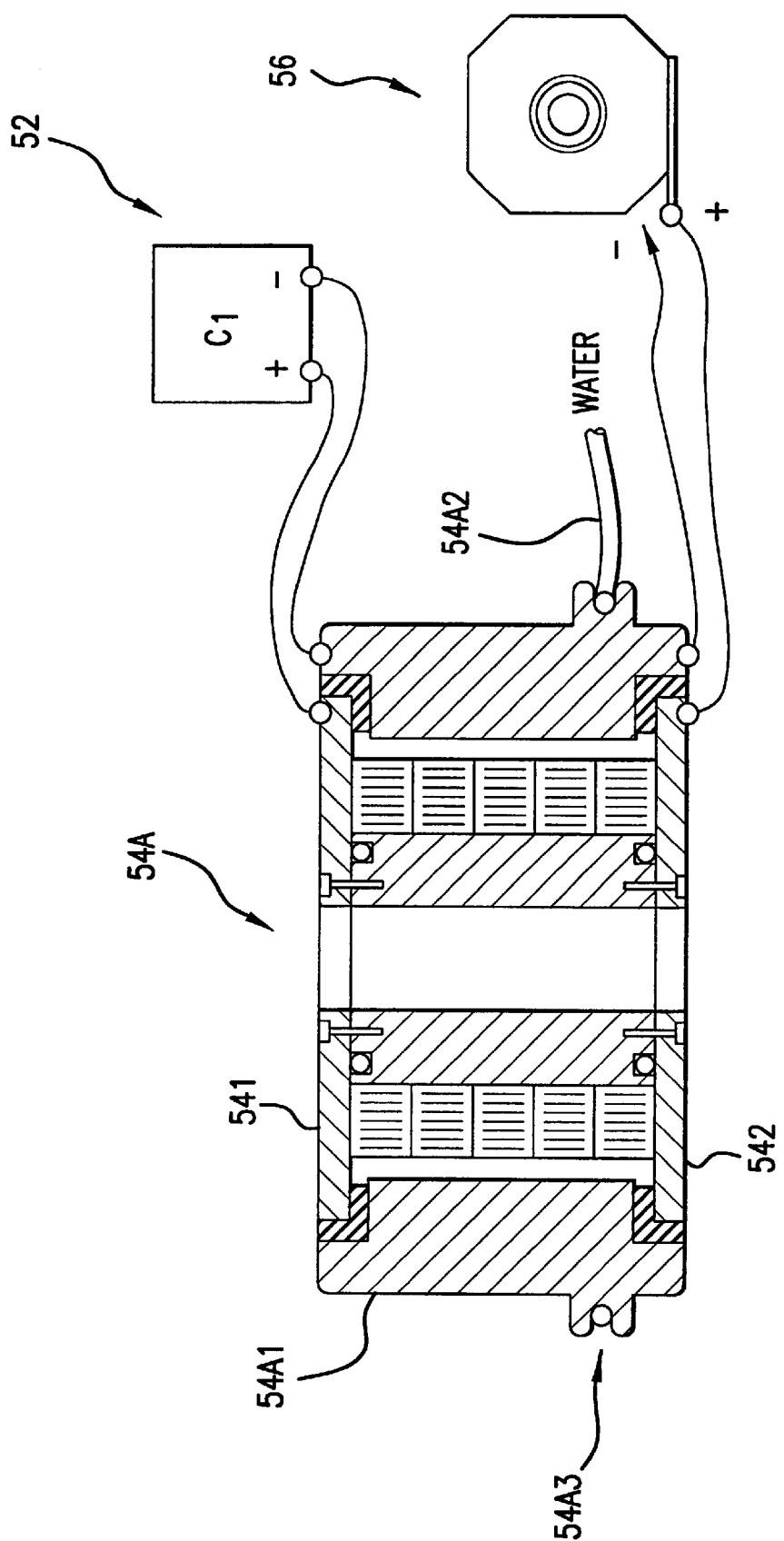
FIG. 14A shows a water cooled saturable inductor.

In the case of the commutator module a water cooled saturable inductor 54A is provided as shown in FIG. 14A which is similar to the inductor 54 shown in FIG. 14 except the fins of 54 are replaced with a water cooled jacket 54A1 as shown in FIG. 14A. The cooling line 54A2 is routed within the module to wrap around jacket 54A1 and through aluminum base plate where the IGBT switches and Series diodes are mounted. These three components make up the majority of the power dissipation within the module. Other items that also dissipate heat (snubber diodes and resistors, capacitors, etc.) are cooled by forced air provided by the two fans in the rear of the module.

Since the jacket 54A1 is held at ground potential, there are no voltage isolation issues in directly attaching the cooling tubing to the reactor housing. This is done by press-fitting the tubing into a dovetail groove cut in the outside of the housing as shown at 54A3 and using a thermally conductive compound to aid in making good thermal contact between the cooling tubing and the housing.

Although the IGBT switches "float" at high voltage, they are mounted on an isolated aluminum base which functions as a heat sink and operates at ground potential and is much easier to cool since high voltage isolation is not required in the cooling circuit. In this case, the cooling tubing is pressed into a groove in an aluminum base on which the IGBT's are mounted. As with the inductor 54a, thermally conductive compound is used to improve the overall joint between the tubing and the base plate.

The Series diodes also "float" at high potential during normal operation. In this case, the diode housing typically used in the design provides no high voltage isolation. To provide this necessary insulation, the diode "hockey puck" package is clamped within a heat sink assembly which is then mounted on top of a ceramic base that is then mounted on top of the water-cooled aluminum base plate. The ceramic base is just thick enough to provide the necessary electrical isolation but not too thick to incur more than necessary thermal impedance. For this specific design, the ceramic is 1/16" thick alumina although other more exotic materials, such as beryllia, can also be used to further reduce the thermal impedance between the diode junction and the cooling water.

A second embodiment of a water cooled commutator utilizes as single cold plate assembly which is attached to the chassis baseplate. As described above, the IGBT's and diodes are designed to transfer their heat into the chassis plate or an aluminum base mounted to the chassis plate by use of the previously mentioned ceramic disk underneath the assembly. In addition, thermally conductive rods or a heat pipe can also be used to transfer heat from the outside housing to the chassis plate.

Detailed Compression Head Description

The water-cooled compression head is similar in the electrical design to the previously described air-cooled version (the same type ceramic capacitors are used, similar material is used in the reactor design, etc.). The primary differences in this case are that the module must run at higher rep-rates and therefore, higher average power. In the case of the compression head module, the majority of the heat is dissipated within the modified saturable inductor 64A. Cooling the subassembly is not a simple matter since the entire housing operates with short pulses of very high voltages. The solution to this issue is to inductively isolate the housing from ground potential. This inductance is provided by wrapping the cooling tubing around two cylindrical forms that contain a ferrite magnetic core. Both the input and output cooling lines are coiled around cylindrical portions of a ferrite core formed of the two cylindrical portions and the two ferrite blocks as shown in FIGS. 8C, D and E.

The ferrite pieces are made from CN-20 material manufactured by Ceramic Magnetics, Inc. of Fairfield, N.J. A single piece of copper tubing (0.187" diameter) is press fit and wound onto one winding form, around the housing 64A1 of inductor 64A and around the second winding form. Sufficient length is left at the ends to extend through fittings in the compression head sheet metal cover such that no cooling tubing joints exist within the chassis.

The inductor 64A comprises a dovetail groove as shown at 64A2 similar to that used in the water-cooled commutator first stage reactor housing. This housing is much the same as previous air-cooled versions with the exception of the dovetail groove. The copper cooling-water tubing is press fit into this groove in order to make a good thermal connection between the housing and the cooling-water tubing. Thermally conductive compound is also added to minimize the thermal impedance.

The electrical design of inductor 64A is changed slightly from that of 64 shown in FIGS. 8A and 8B. Inductor 64A provides only two loops (instead of five loops) around magnetic core 64A3 which is comprised of four coils of tape (instead of three).

As a result of this water-cooled tubing conductive path from the output potential to ground, the bias current circuit is now slightly different. As before, bias current is supplied by a dc-dc converter in the commutator through a cable into the compression head. The current passes through the "positive" bias inductor LB2 and is connected to the Cp–1 voltage node. The current then splits with a portion returning to the commutator through the HV cable (passing through the transformer secondary to ground and back to the dc-dc converter). The other portion passes through the compression head reactor Lp–1 (to bias the magnetic switch) and then through the cooling-water tubing "negative" bias inductor LB3 and back to ground and the dc-dc converter. By balancing the resistance in each leg, the designer is able to ensure that sufficient bias current is available for both the compression head reactor and the commutator transformer.

The "positive" bias inductor $L_{B2}$ is made very similarly to the "negative" bias inductor $L_{B3}$. In this case, the same ferrite bars and blocks are used as a magnetic core. However, two 0.125" thick plastic spacers are used to create an air gap in the magnetic circuit so that the cores do not saturate with the dc current. Instead of winding the inductor with cooling-water tubing, 18 AWG teflon wire is wound around the forms.

Heat Exchangers

A preferred embodiment of the present invention utilizes four finned water cooled heat exchangers 58A shown generally in FIG. 4. Each of these heat exchangers is somewhat similar to the single heat exchangers shown at 58 in FIG. 1 having however substantial improvements.

Heat Exchanger Components

A cross sectional drawing of one of the heat exchangers is shown in FIG. 21. The middle section of the heat exchanger is cut out but both ends are shown. FIG. 21A shows an enlarged view of the end of the heat exchanger which accommodates thermal expansion and contraction.

The components of the heat exchanger includes a finned structure 302 which is machined from solid copper (CU 11000) and contains twelve fins 303 per inch. Water flow is through an axial passage having a bore diameter of 0.33 inch. A plastic turbulator 306 located in the axial passage prevents stratification of water in the passage and prevents the formation of a hot boundary layer on the inside surface of the passage. A flexible flange unit 304 is a welded unit comprised of inner flange 304A, bellows 304B and outer flange 304C. The heat exchanger unit includes three c-seals 308 to seal the water flowing in the heat exchanger from the laser gas.

Bellows 304B permits expansion and contraction of the heat exchanger relative to the chamber. A double port nut 400 connects the heat exchanger passage to a standard 5/16 inch positional elbow pipe fitting which in turn is connected to a water source. O-ring 402 provides a seal between nut 400 and finned structure 302.

The Turbulator

Figures 16, 16A:
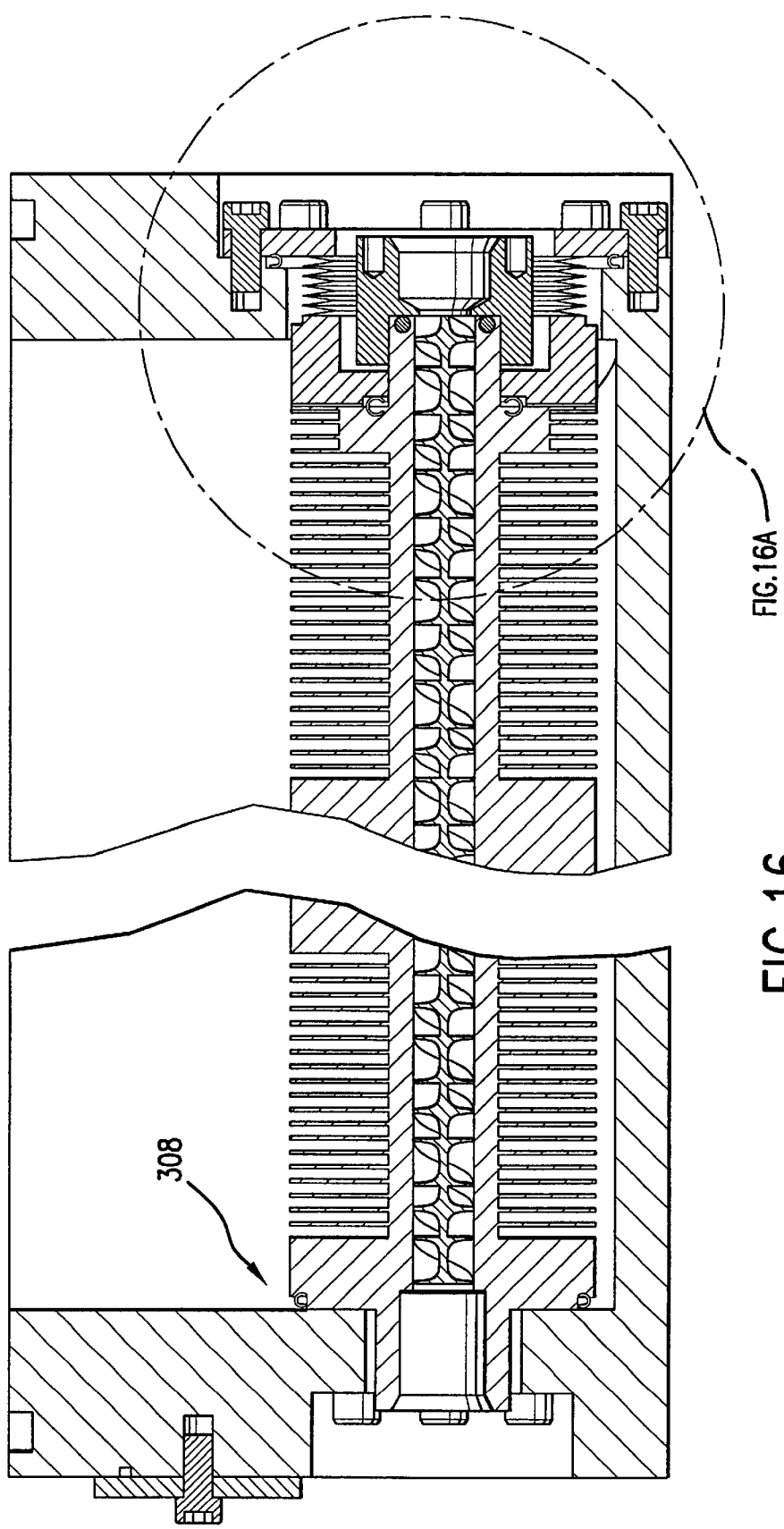
FIGS. 16 and 16A shows views of a preferred heat exchanger.
Figure 16A:
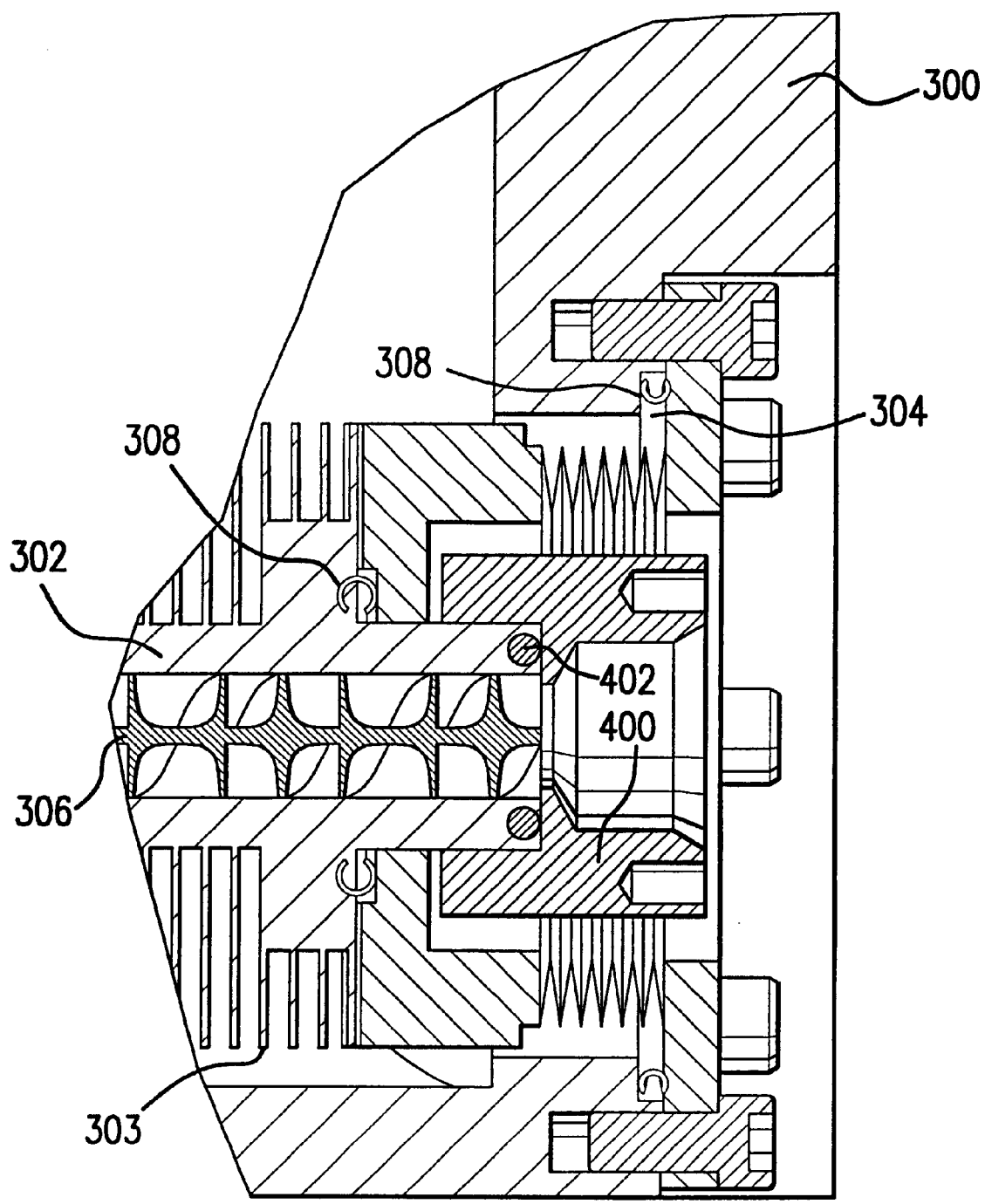

In a preferred embodiment, the turbulator is comprised of four off-the-shelf, long in-line mixing elements which are typically used to mix epoxy components and are available from 3M Corporation (Static Mixer, Part No. 06-D1229-00). The in-line mixers are shown at 306 in FIGS. 16 and 16A. The in-line mixers force the water to flow along a generally helical path which reverses its clockwise direction about every pitch distance (which is 0.3 inch). The turbulator substantially improves heat exchanger performance. Tests by Applicants have shown that the addition of the turbulator reduces the required water flow by a factor of roughly 5 to maintain comparable gas temperature conditions.

Various modifications may be made to the present invention without altering its scope. Those skilled in the art will recognize many other possible variations. Other techniques for minimizing motor losses associated with the rotor pressure cup could be used. Kevlor or a similar tough material could be provided to help support the thin mital or aluminium ixide cup. Other heat exchanger designs should be obvious modifications to the one configuration shown herein. For example, all four units could be combined into a single unit. There could be significant advantages to using much larger fins on the heat exchanger to moderate the effects of rapid changes in gas temperature which occurs as a result of burst mode operation of the laser. The reader should understand that at extremely high pulse rates the feedback control on pulse energy does not necessarily have to be fast enough to control the pulse energy of a particular pulse using the immediately preceding pulse. For example, control techniques could be provided where measured pulse energy for a particular pulse is used in the control of the second or third following pulse. Many variations and modifications in the algorithm for converting wavemeter etalon and grating data to wavelength values are possible. Accordingly, the above disclosure is not intended to be limiting and the scope of the invention should be determined by the appended claims and their legal equivalents.

We claim:

1. An extreme repetition rate gas discharge laser capable of operating at pulse repetition rates in the range of 4,000 to 6,000 pulses per second, said laser comprising:
   A) a laser chamber having two elongated electrodes, defining a discharge region and containing laser gas,
   B) a squirrel cage type tangential fan for circulating said laser gas producing sufficient gas velocities in said discharge region to clear from said discharge region, following each pulse, substantially all discharge produced ions prior to a next pulse when operating at a repetition rate in the range of 4,000 pulses per second or greater,
   C) a finned heat exchanger system capable of removing at least 16 kw of heat energy from said laser gas,
   D) a pulse power system configured to provide electrical pulses to said electrodes sufficient to produce laser pulses at rates of at least 4,000 pulses per second with precisely controlled pulse energies in the range of about 5 mJ to 10 mJ, and
   E) a laser beam measurement and control system capable of measuring pulse energy energy wavelength and bandwidth of substantially every pulse with feedback control of pulse energy and wavelength, and
   F) a liquid cooled motor, defining a rotor and a stator, driving said tangential fan, said motor comprising; 1) a pressure cup sealing member separating said stator from said rotor and protecting said stator from said laser gas and 2) a breach detection means for detecting a breach of said sealing member.

2. A laser as in claim 1 wherein said liquid cooled motor is a water cooled motor.

3. A laser as in claim 2 wherein said pressure cup sealing member is comprised of a metal no thicker than about 0.005 inch.

4. A laser as in claim 2 wherein said pressure cup is comprised of a non-conductive material.

5. A laser as in claim 4 wherein said bearings are comprised of a roller bearing and a ball bearing.

6. A laser as in claim 4 wherein said ceramic bearings are two ball bearings defining a drive bearing and an idle bearing.

7. A laser as in claim 2 wherin said pressure cup is comprised of a ceramic material.

8. A laser as in claim 7 wherein said ceramic material is aluminium oxide.

9. A laser as in claim 7 wherein preload applied to said ball bearing by a drive motor having a stator and a rotor with its rotor defining an axial magnetic center, said center being slightly off center of a magnetic field produced by the stator.

10. A laser as in claim 2 wherein said water cooled motor comprises a helical coil water path surrounding said stater.

11. A laser as in claim 2 and wherein said chamber also comprises a vane structure upstream of said discharge region for normalizing gas velocity upstream of said discharge region.

12. A laser as in claim 1 wherein said detection means is a pressure detector.

13. A laser as in claim 12 wherein said pressure detector is configured to de-energize said motor in the event of a rupture of said pressure cup.

14. A laser as in claim 13 wherein said magnetic force is produced by a drive motor.

15. A laser as in claim 12 wherein preload is applied to both of said bearings with a spring and additional preload is applied to said drive bearing by a magnetic force.

16. A laser as in claim 1 wherein said finned heat exchanger system is water cooled.

17. A laser as in claim 16 wherein said heat exchanger system comprises at least four separate water cooled heat exchangers.

18. A laser as in claim 17 wherein each of said four heat exchangers comprise a tubular water flow passage containing a turbulator.

19. A laser as in claim 16 wherein heat exchanger system comprises at least one heat exchanger having a tubular water flow passage wherein at least one turbulator is located in said path.

20. A laser as in claim 1 wherein said pulse power power system comprise water cooled electrical components.

21. A laser as in claim 20 wherein at least one of said water cooled components is a component operated at high voltages in excess of 12,000 volts.

22. A laser as in claim 21 wherein said high voltage is isolated from ground using an inductor through which cooling water flows.

23. A laser as in claim 1 wherein said pulse power system comprises a resonant charging system to charge a charging capacitor to a precisely controlled voltage.

24. A laser as in claim 23 wherein said resonance charging system comprises a De-Qing circuit.

25. A laser as in claim 23 wherein said resonance charging system comprises a bleed circuit.

26. A laser as in claim 23 wherein said resonant charging system comprises a De-Qing circuit and a bleed circuit.

27. A laser as in claim 1 wherein said pulse power system comprises a charging system comprised of at least three power supplies arranged in parallel.

28. A laser as in claim 1 wherein said fan comprises a shaft supported by ceramic bearings.

* * * * *